United States Patent
Yoo et al.

(10) Patent No.: US 7,583,095 B2
(45) Date of Patent: Sep. 1, 2009

(54) HIGH-DENSITY PROBE ARRAY

(75) Inventors: Dong-Chul Yoo, Gyeonggi-do (KR); Byoung-Jae Bae, Gyeonggi-do (KR); Jang-Eun Heo, Seoul (KR); Ji-Eun Lim, Gyeonggi-do (KR); Dong-Hyun Im, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 329 days.

(21) Appl. No.: 11/464,571

(22) Filed: Aug. 15, 2006

(65) Prior Publication Data

US 2007/0210812 A1  Sep. 13, 2007

(30) Foreign Application Priority Data

Mar. 7, 2006  (KR) ............... 10-2006-0021479

(51) Int. Cl.
*G01R 31/02* (2006.01)
(52) U.S. Cl. ..................... 324/754
(58) Field of Classification Search ........ 324/754; 29/846, 847, 848, 830, 831
See application file for complete search history.

(56) References Cited

U.S. PATENT DOCUMENTS 6,690,186 B2 * 2/2004 Fjelstad .................. 324/762
2004/0047275 A1   3/2004 Cherubini et al.
2005/0253606 A1 * 11/2005 Kim et al. ................ 324/754
2006/0108678 A1   5/2006 Kumar et al.

FOREIGN PATENT DOCUMENTS

JP    2004-213751      7/2004
KR    2001-0073306     8/2001
KR    10-2004-0042387  5/2004

OTHER PUBLICATIONS

English language abstract of Korean Publication No. 2001-0073306.
English language abstract of Korean Publication No. 10-2004-0042387.
English language abstract of Japanese Publication No. 2004-213751.

* cited by examiner

*Primary Examiner*—Ha Tran T Nguyen
*Assistant Examiner*—Shaun Campbell
(74) *Attorney, Agent, or Firm*—Marger Johnson & McCollom, P.C.

(57) ABSTRACT

A probe array may be fabricated by forming probes arranged on a sacrificial substrate, forming a probe substrate above the probes, and removing the sacrificial substrate. In one embodiment, first probes may be two-dimensionally formed in row and column directions on a sacrificial substrate. Second probes may be formed between the first probes arranged in the row direction such that a distance between the first and second probes is smaller than the resolution limit in a lithography process. A probe substrate may be formed on the sacrificial substrate having the first and second probes, and the sacrificial substrate may be removed.

16 Claims, 38 Drawing Sheets

PA

PB

FIG. 2A
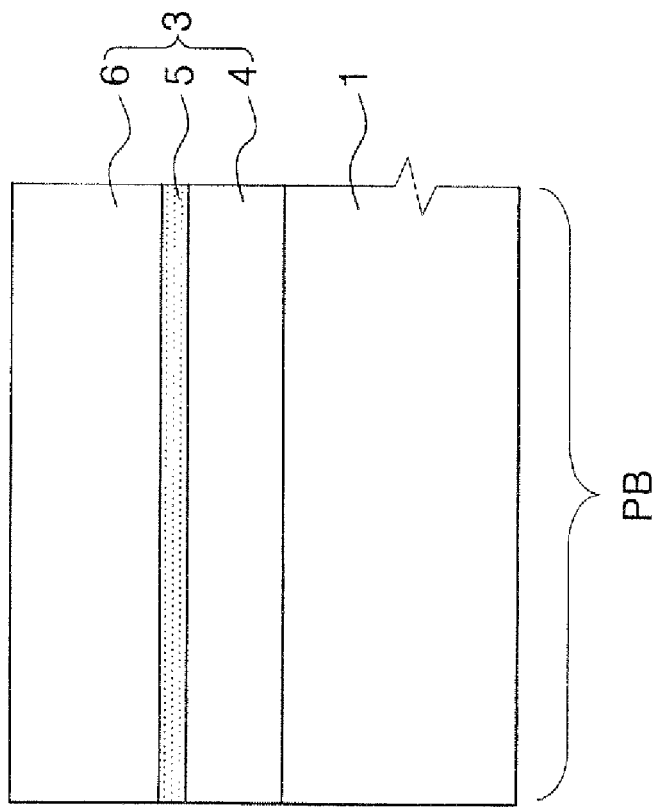
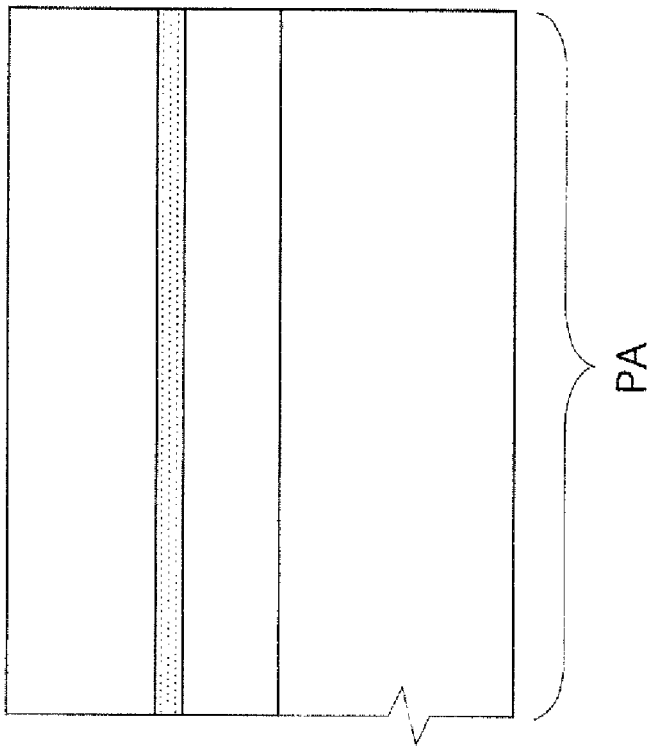

FIG. 2B
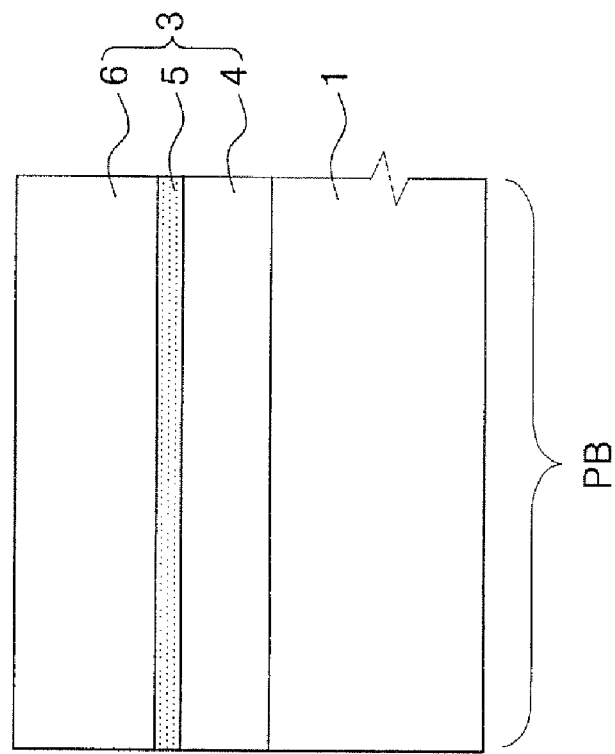
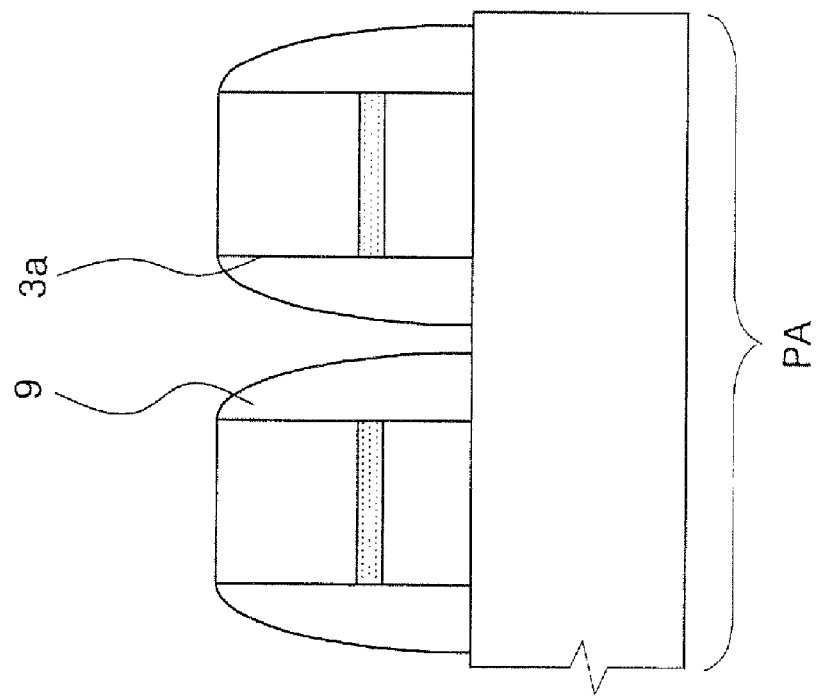

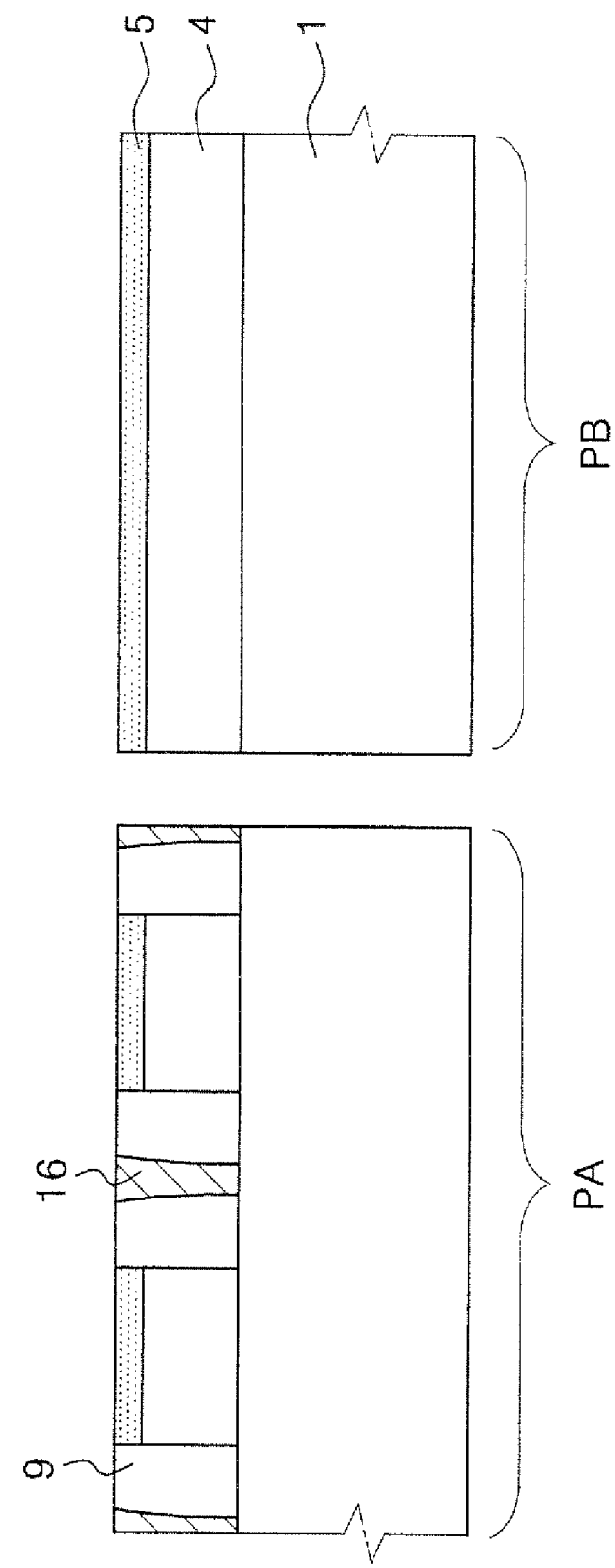

FIG. 2E
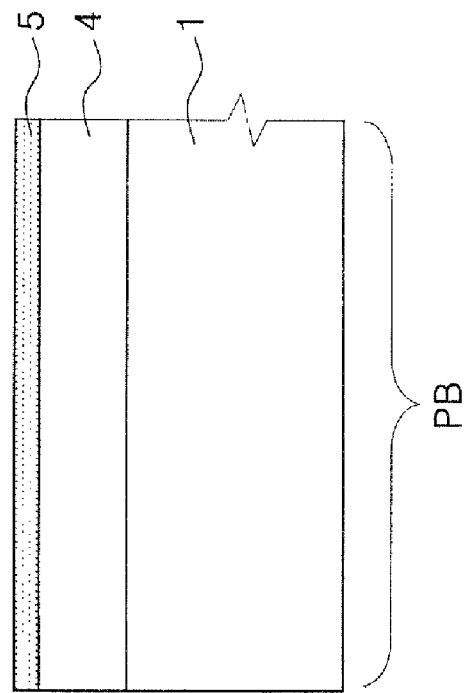
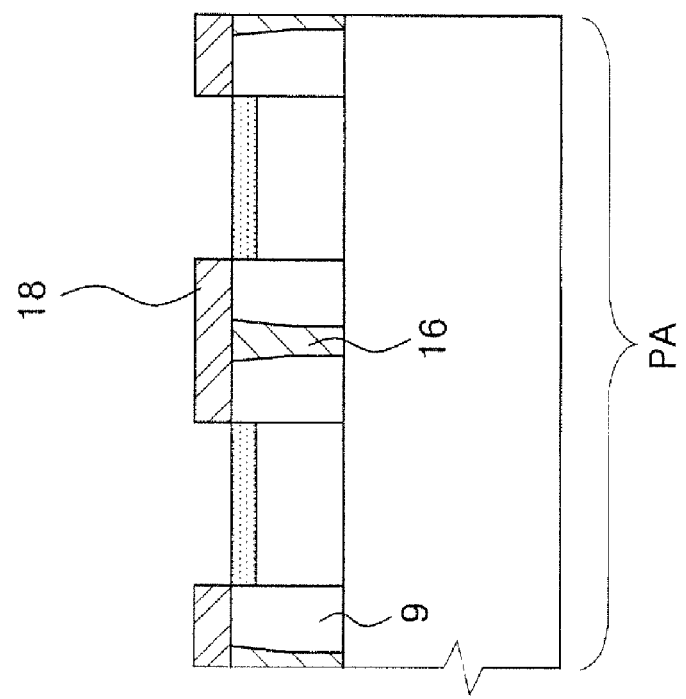

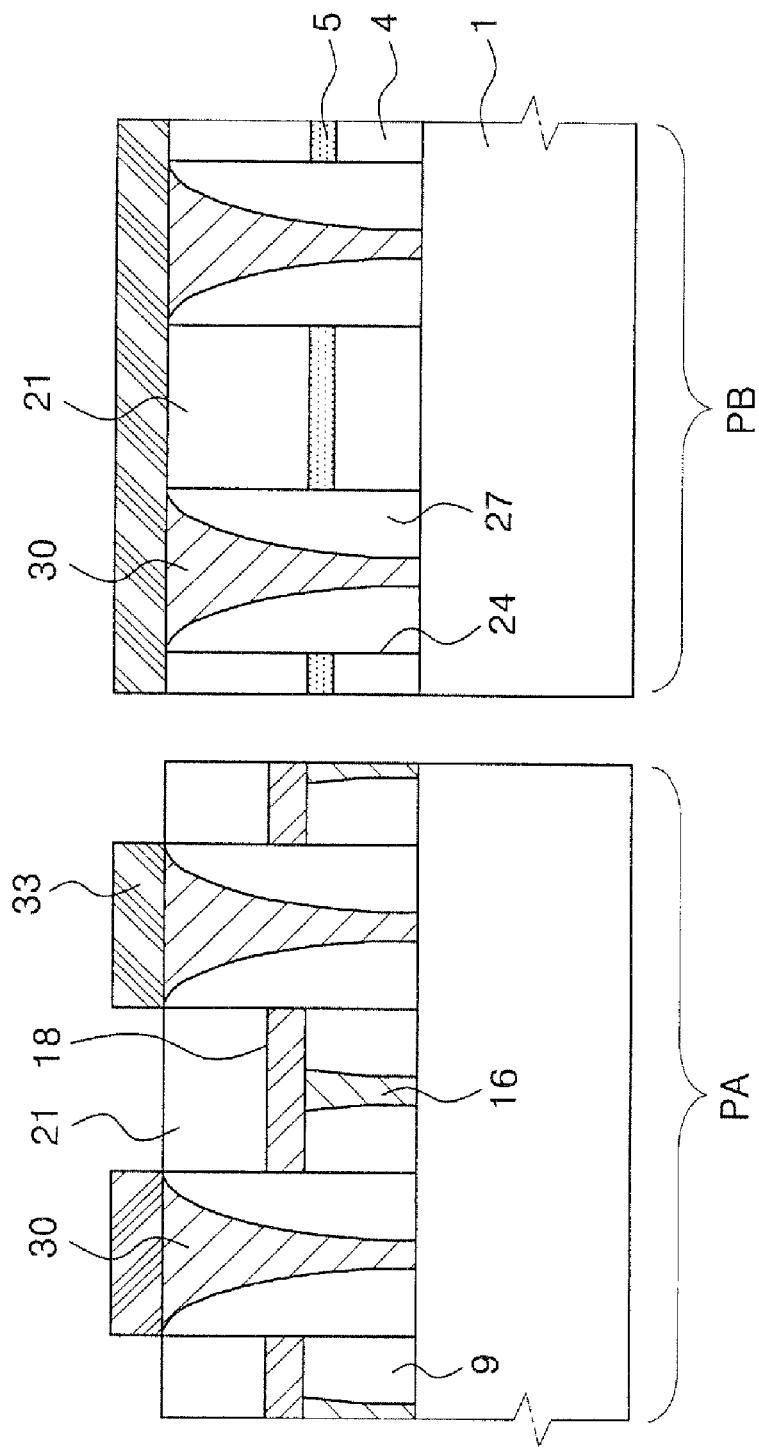

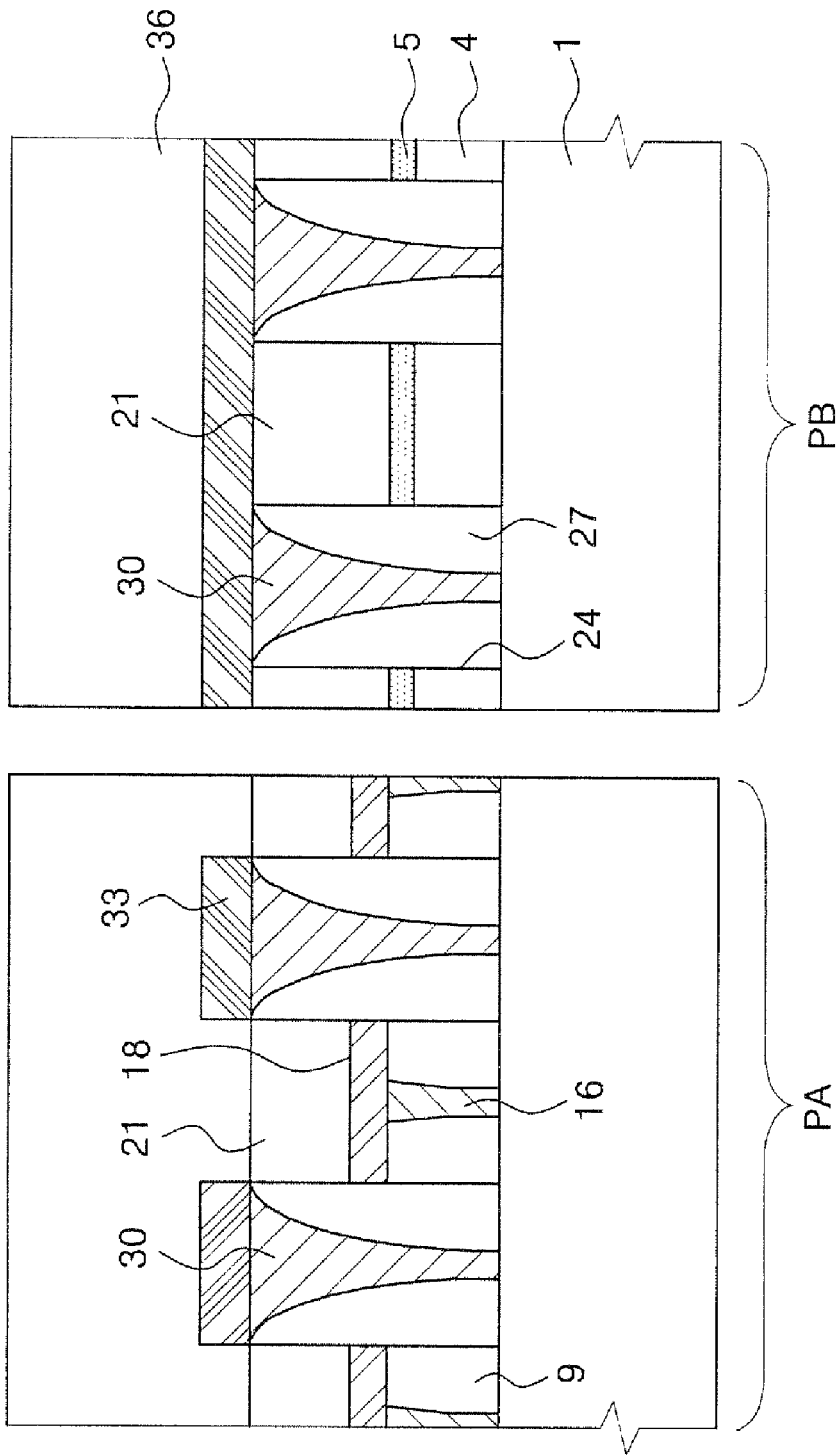

FIG. 3B
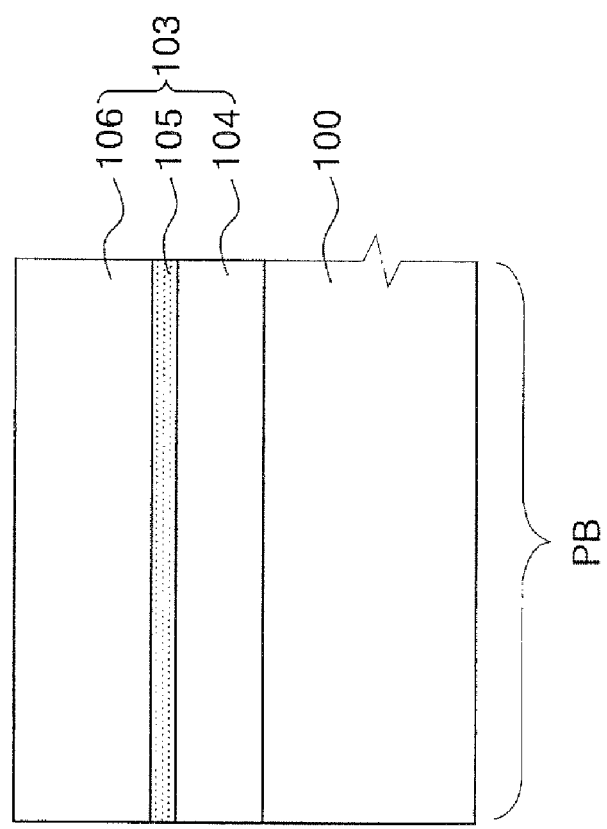
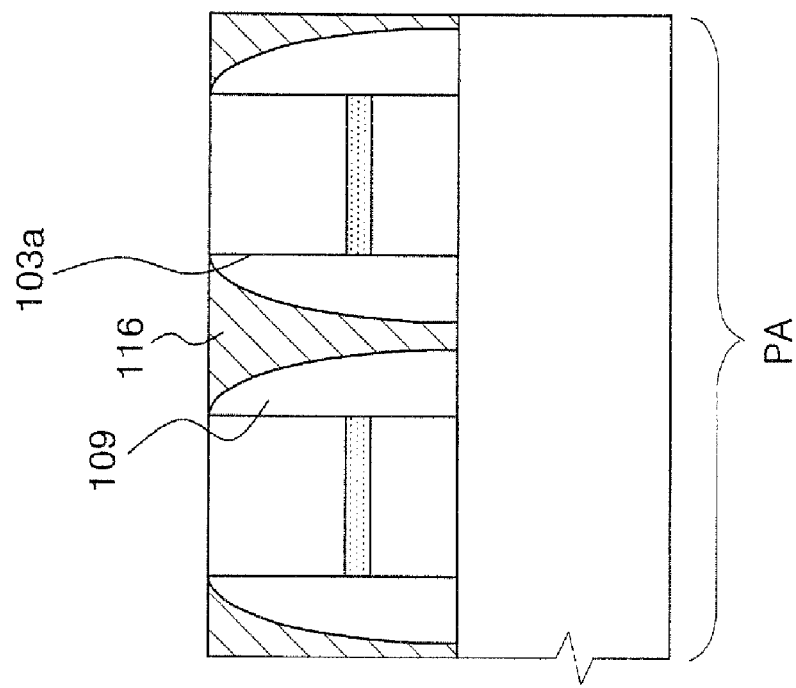

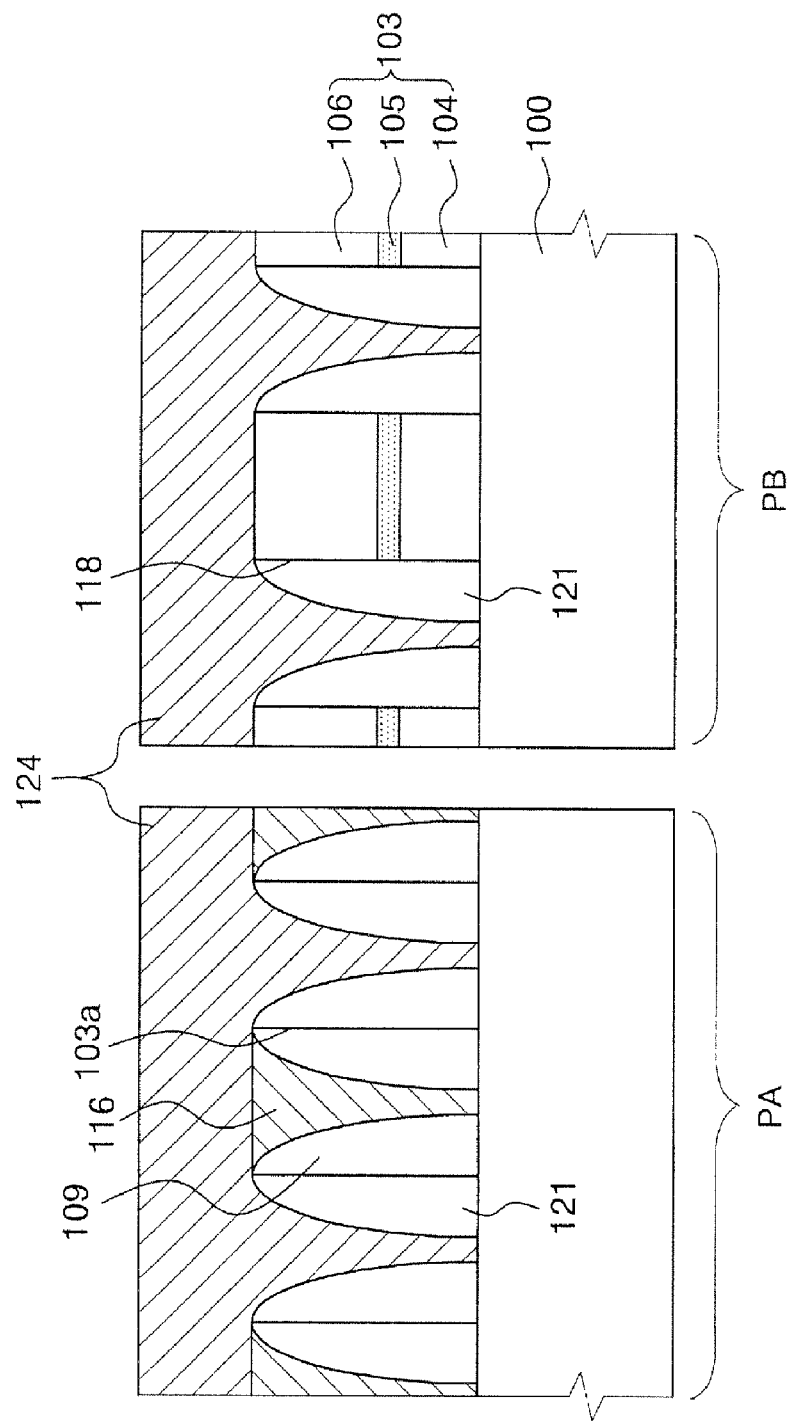

FIG. 3G
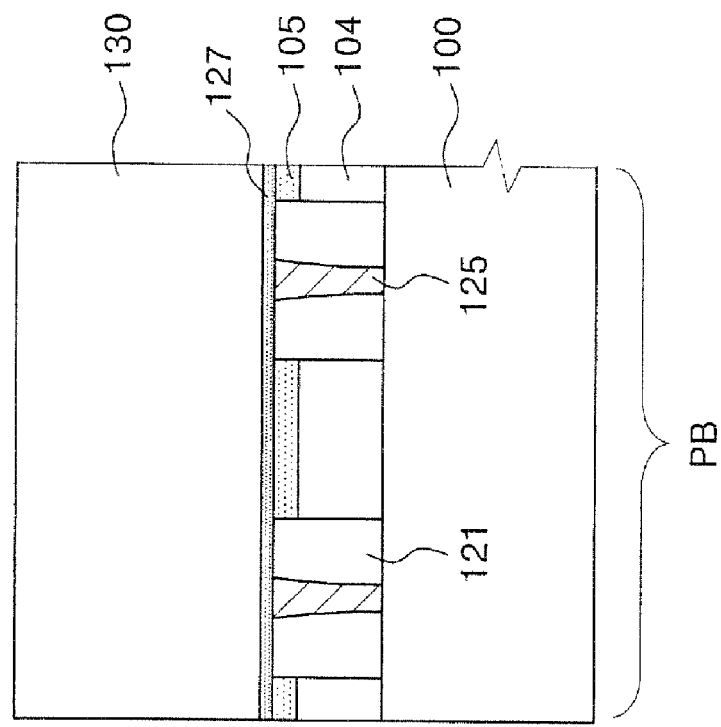
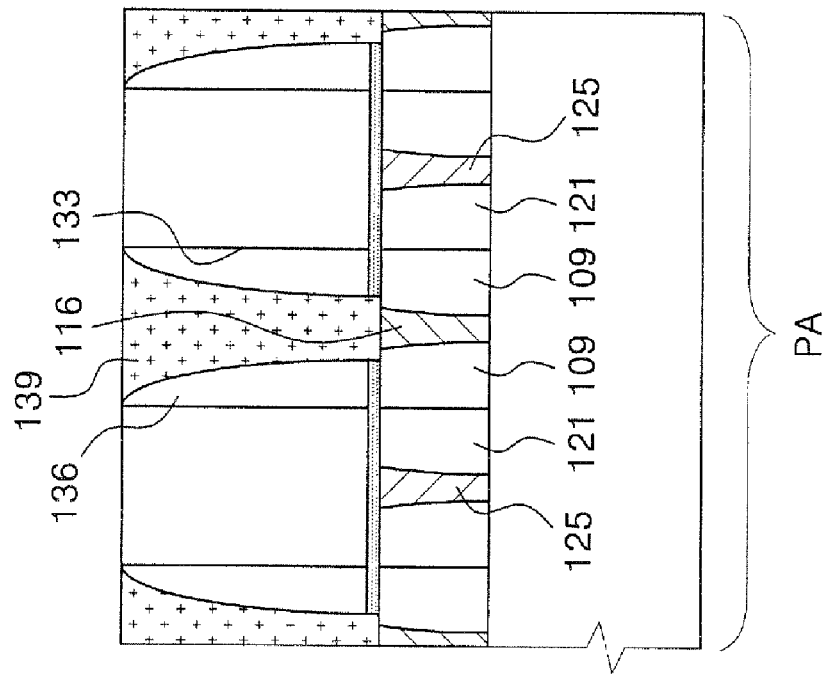

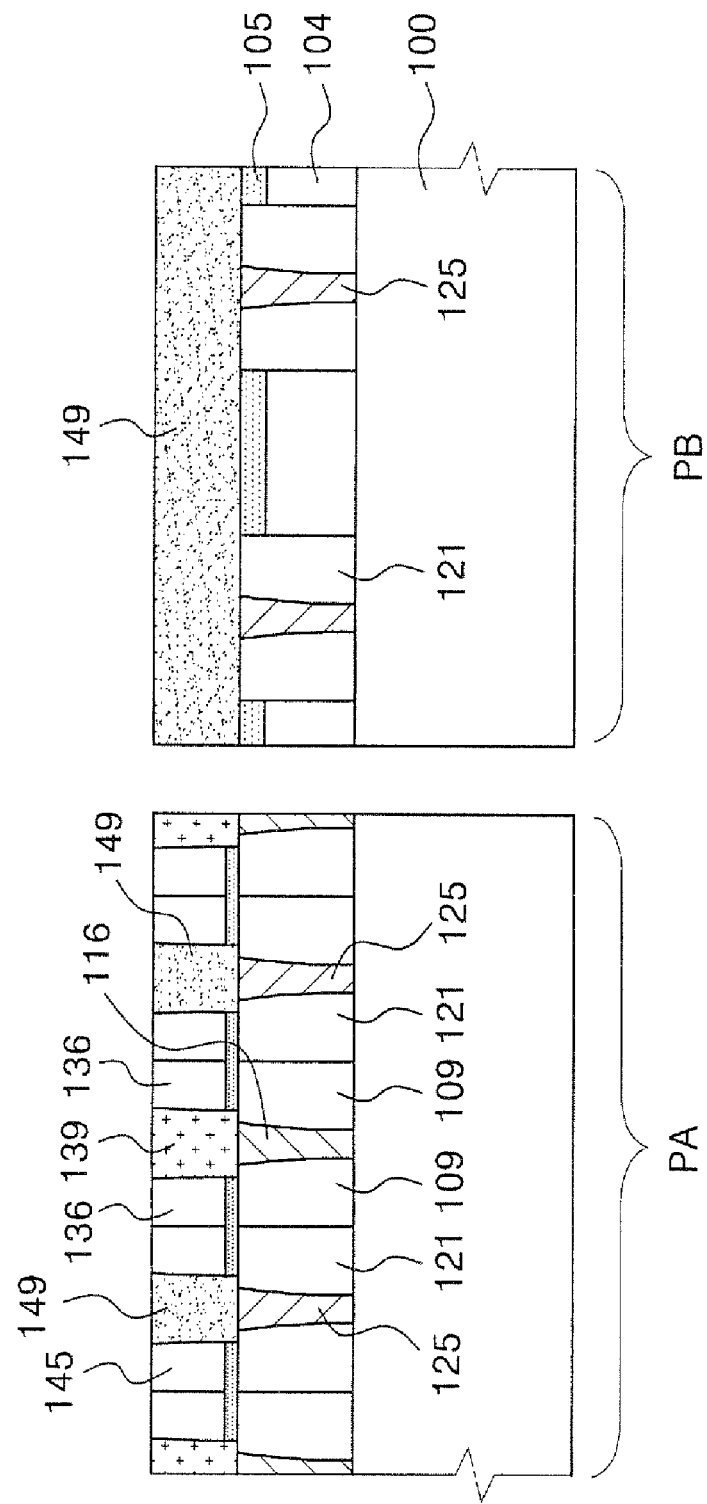

FIG. 4A
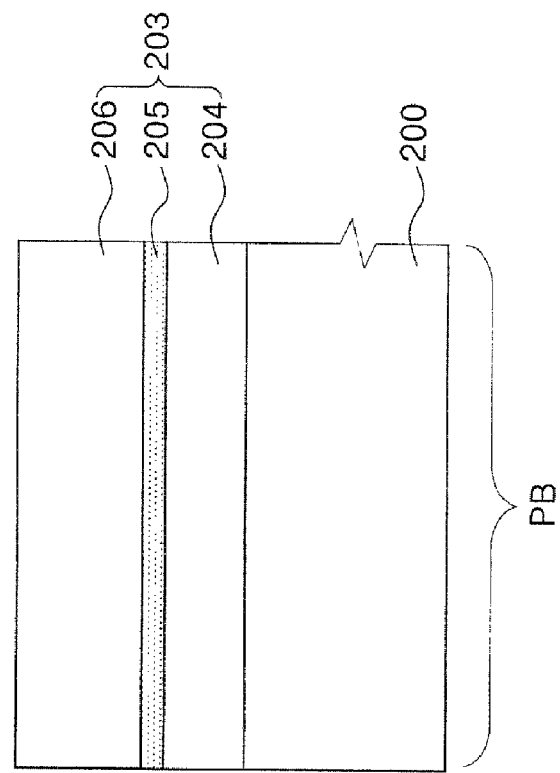
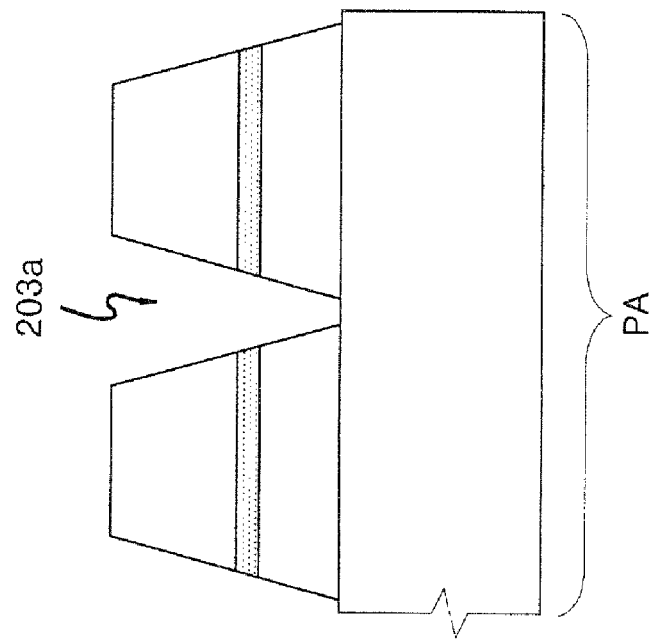

FIG. 4C
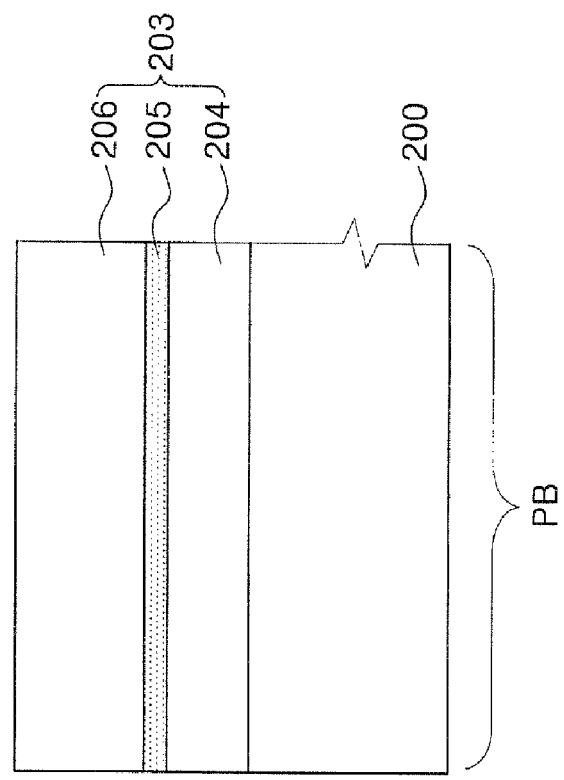
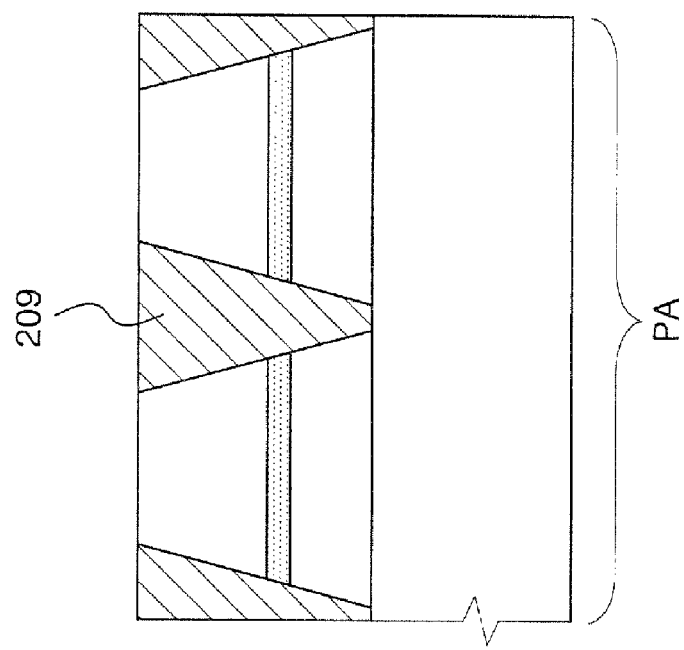

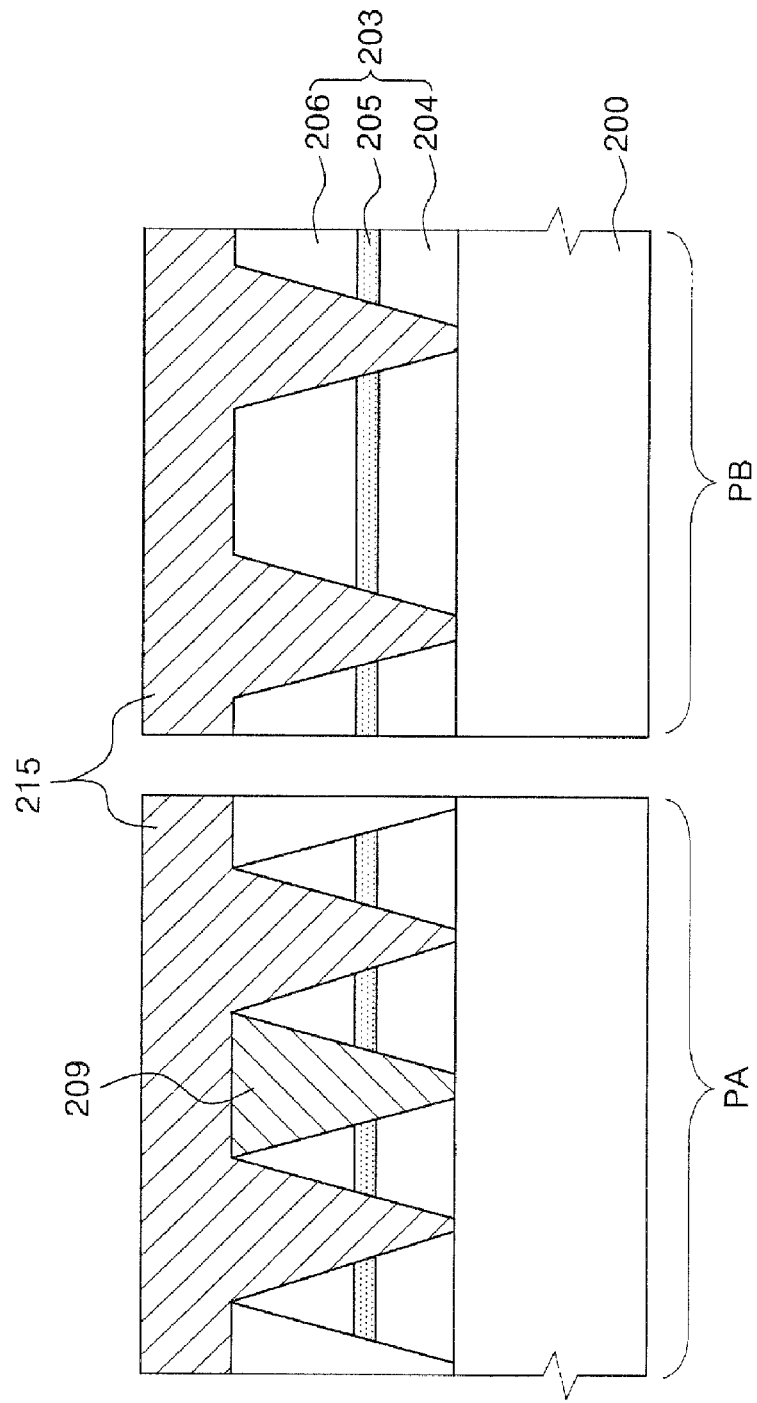

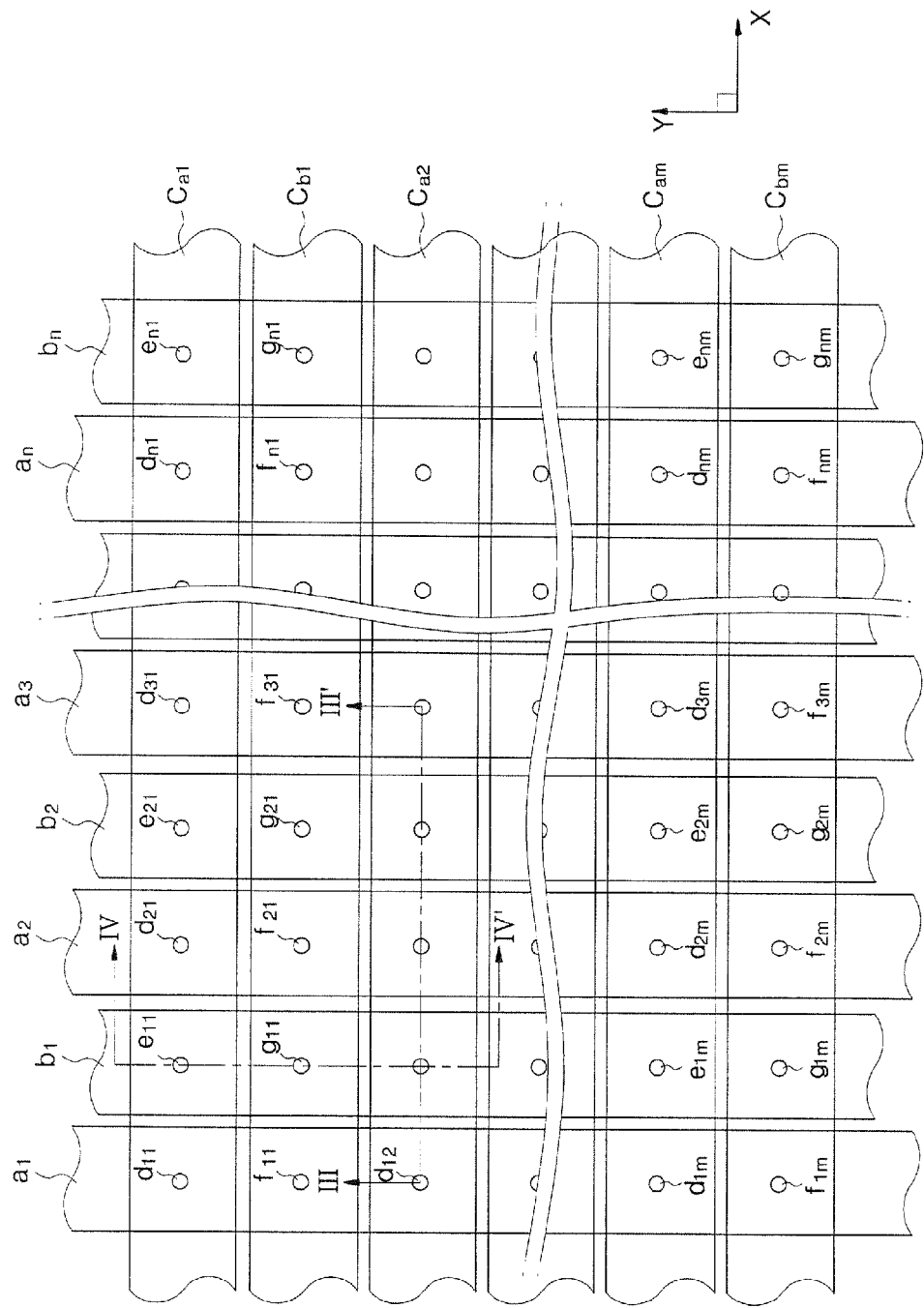

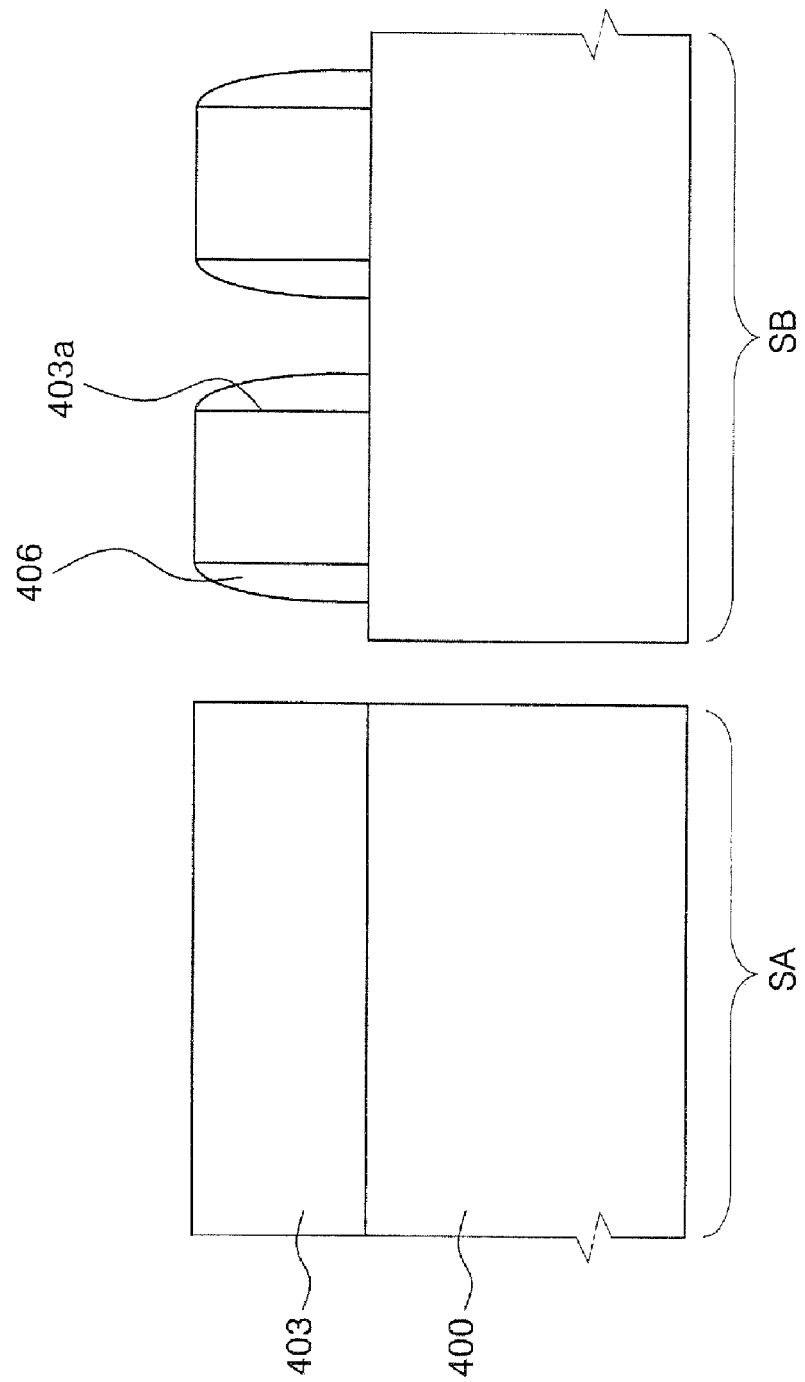

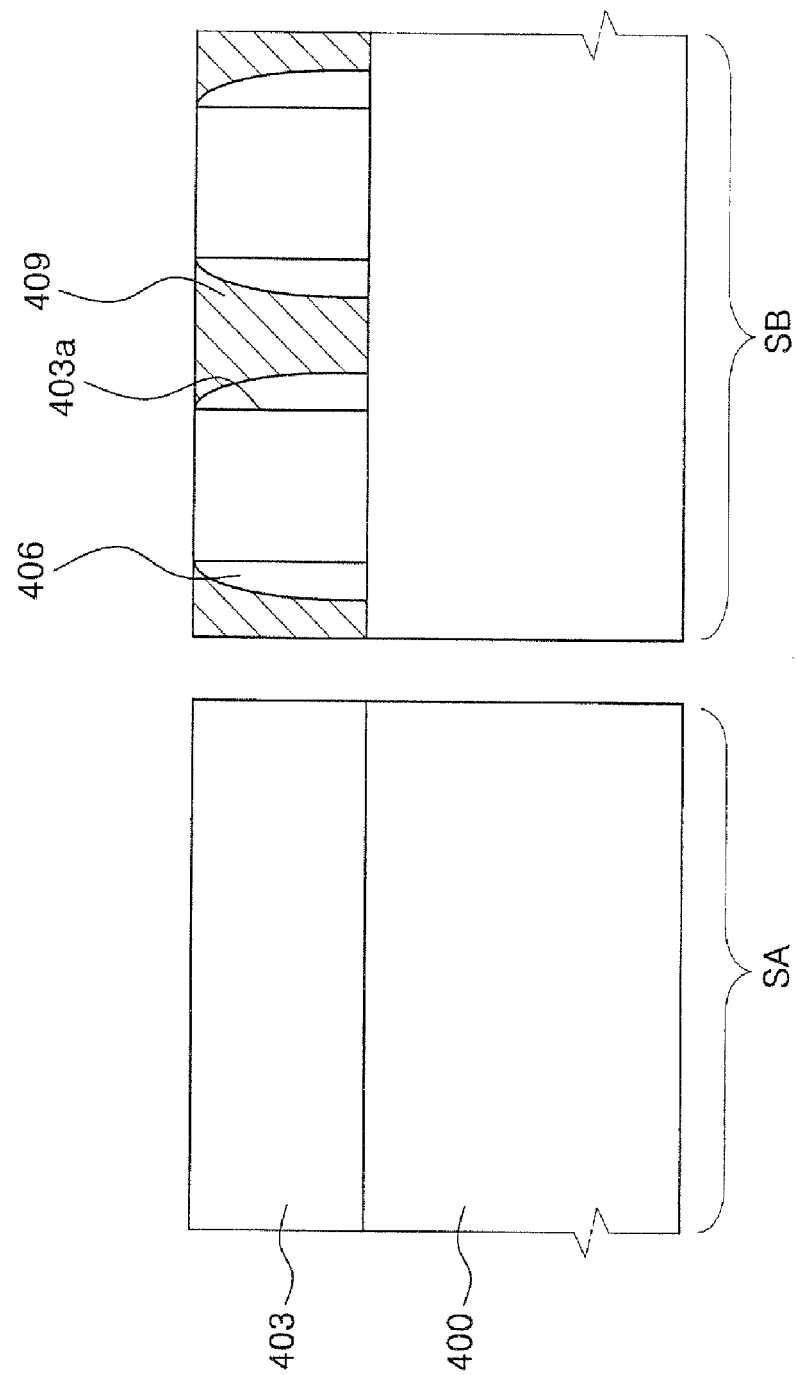

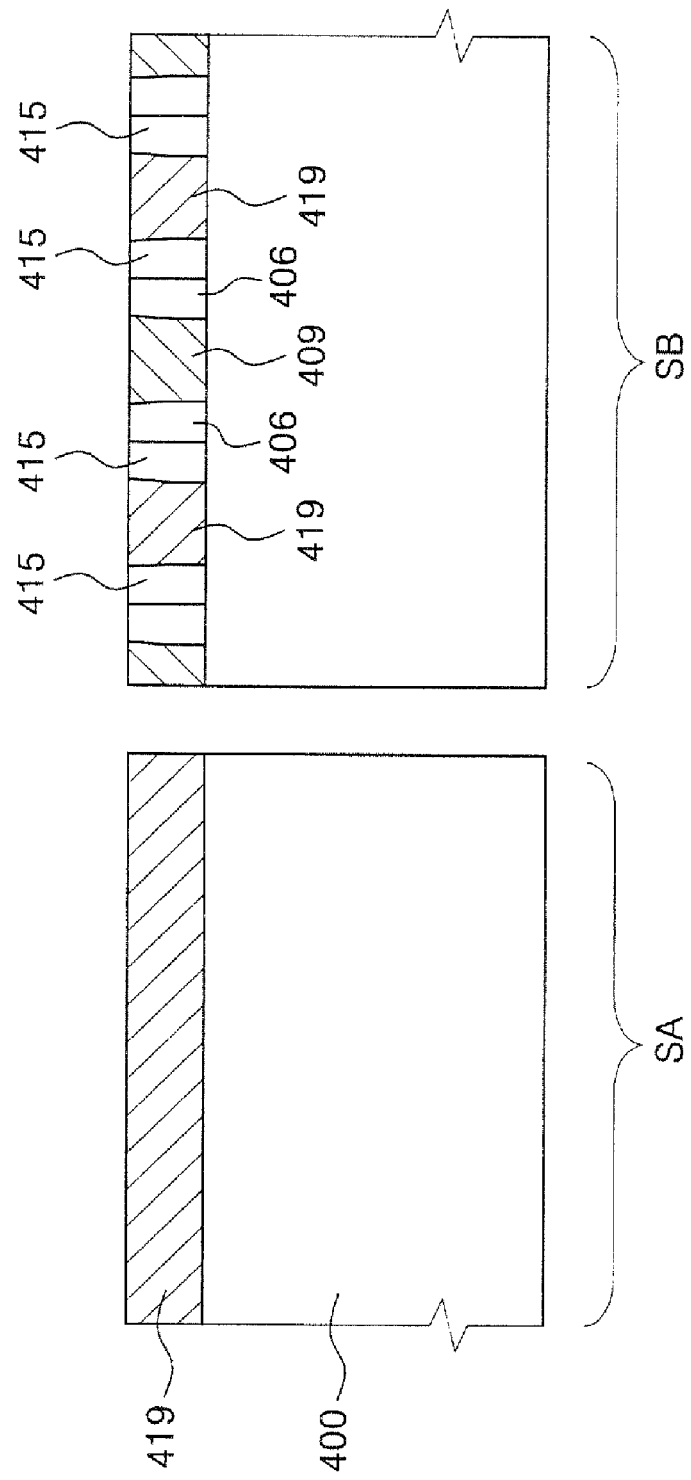

HIGH-DENSITY PROBE ARRAY

CROSS-REFERENCE TO RELATED APPLICATION

This application claims priority from Korean Patent Application 10-2006-0021479, filed on Mar. 7, 2006, which is incorporated by reference.

BACKGROUND

Hard disks and optical disks are commonly used as data storage units. However, due to the super-paramagnetic limit of a hard disk or the laser diffraction limit of an optical disk, there is a limit to the amount of data that can be stored with these conventional devices.

In order to overcome these restrictions, a high-density data storage device using scanning probe microscopy (SPM) technology has been proposed. This data storage device includes a data storage medium, a probe tip for writing data to or reading data from the data storage medium, a probe including a cantilever on which the probe is mounted, a scanner for transferring the data storage medium, a controller for issuing commands to the storage device and controlling the operation of the storage device, and a signal processor. However, even though such a conventional storage device can store a large amount of data, it cannot be easily put to practical use because of the following problems. Since only a limited number of probe tips can be installed on the data storage medium, each probe tip must be transferred over a long distance to access or write data. For example, each probe tip may have to move through intervals of about 100 μm along x- and y-axes of the data storage medium for data to be read or written. Also, the data storage device needs a servomechanism for precisely controlling the position of the probe tip, and a unit capable of moving along a z-axis to prevent wear of the probe tip. As a result, the size of the cantilever increases, the circuit for driving the cantilever becomes more complicated, and power consumption increases. Further, a data storage device using a cantilever cannot randomly access data, and hence the access time increases.

A conventional storage device is disclosed in U.S. Patent Publication No. 2004/0047275 entitled "Storage Device and Method for Operating a Storage Device" by Cherubini, et al. The storage device described therein can neither effectively store high-density data nor randomly access the data. This is because a heater platform and probe tips are mounted on a cantilever, thus making it difficult to sufficiently increase the number of probe tips and reduce the space occupied by the cantilever.

SUMMARY

Some of the inventive principles of this patent disclosure relate to a probe array that may be fabricated by forming probes arranged on a sacrificial substrate, forming a probe substrate above the probes, and removing the sacrificial substrate. In one embodiment, first probes may be two-dimensionally formed in row and column directions on a sacrificial substrate. Second probes may be formed between the first probes arranged in the row direction such that a distance between the first and second probes is smaller than the resolution limit in a lithography process. A probe substrate may be formed on the sacrificial substrate having the first and second probes, and the sacrificial substrate may be removed.

In some embodiments, the first probes may be fabricated by forming a mold insulating layer on the sacrificial substrate, patterning the mold insulating layer, thereby forming first holes exposing the sacrificial substrate, forming a first conductive layer on the sacrificial substrate having the first holes, and planarizing the first conductive layer. First hole spacers may be formed to cover sidewalls of the first holes after forming the first holes. The mold insulating layer may include a lower mold insulating layer, a planarization stop layer, and an upper mold insulating layer that are sequentially stacked, the upper mold insulating layer being removed during the planarization of the second conductive layer. A top surface of each of the first and second probes may have an area equal to or greater than a bottom surface thereof. First metal interconnections may be formed to cover the first probes arranged in the column direction, and second metal interconnections may be formed between the first metal interconnections to cover the second probes. Forming the first metal interconnections may include forming an intermetal dielectric layer on the sacrificial substrate having the first and second probes, patterning the intermetal dielectric layer, thereby forming first grooves exposing the first probes arranged in the column direction, forming first groove spacers to cover sidewalls of the first grooves, forming a first metal layer on the sacrificial substrate having the first groove spacers, and planarizing the first metal layer.

Some inventive principles of this patent disclosure relate to a method of fabricating a storage device by forming a data storage element on a storage substrate, forming probes on a sacrificial substrate, forming a probe substrate over probes, removing the sacrificial substrate, and aligning the probe substrate and the storage substrate such that the data storage element is disposed opposite to the probes.

Some inventive principles of this patent disclosure relate to a storage device having a storage substrate, a data storage element disposed on the storage substrate and having a plurality of data storage regions, a probe substrate over the data storage element; and probes positioned on the data storage element and aligned with the storage substrate.

Some inventive principles of this patent disclosure relate to a storage device having a storage substrate, a data storage element disposed on the storage substrate and having a plurality of data storage regions, a probe substrate over the data storage element; and probes positioned on the data storage element and aligned with the storage substrate.

Some inventive principles of this patent disclosure relate to a storage device assembly including a data storage element disposed on a storage substrate and having a plurality of data storage regions, a probe substrate on the data storage element, first probes positioned on the data storage element, fixed under the probe substrate, and arranged two-dimensionally in row and column directions, second probes disposed between the first probes under the probe substrate, a distance between the first and second probes being smaller than the resolution limit in a lithography process, and a control unit to move the probe substrate or the storage substrate.

In some embodiments, the first and second probes correspond to the respective data storage regions, a surface of each of the data storage regions is divided into multiple quadrants, and a central portion of each of the multiple quadrants is a binary digit portion. Each of the data storage regions may be divided into four quadrants. The control unit may move the probe substrate or the storage substrate such that one probe corresponding to one data storage region is positioned on one selected from the multiple quadrants of the data storage region.

Some inventive principles of this patent disclosure relate to a method of reading/writing data from/to a storage device by two-dimensionally arranging probes in row and column directions on a data storage element having a plurality of data storage regions, wherein the probes correspond to the respective data storage regions, a surface of each of the data storage regions is divided into multiple quadrants, and a central portion of each of the multiple quadrants is a binary digit portion.

BRIEF DESCRIPTION OF THE DRAWINGS

FIGS. 2A through 2I are cross-sectional views illustrating a method of fabricating a probe array according to an exemplary embodiment of the present invention.

FIGS. 3A through 3K are cross-sectional views illustrating a method of fabricating a probe array according to another exemplary embodiment of the present invention.

FIGS. 4A through 4G are cross-sectional views illustrating a method of fabricating a probe array according to still another exemplary embodiment of the present invention.

FIG. 5 is a plan view of a storage device according to other exemplary embodiments of the present invention.

FIGS. 6A through 6F are cross-sectional views of a storage medium according to yet another exemplary embodiment of the present invention.

DETAILED DESCRIPTION

Figure 1:
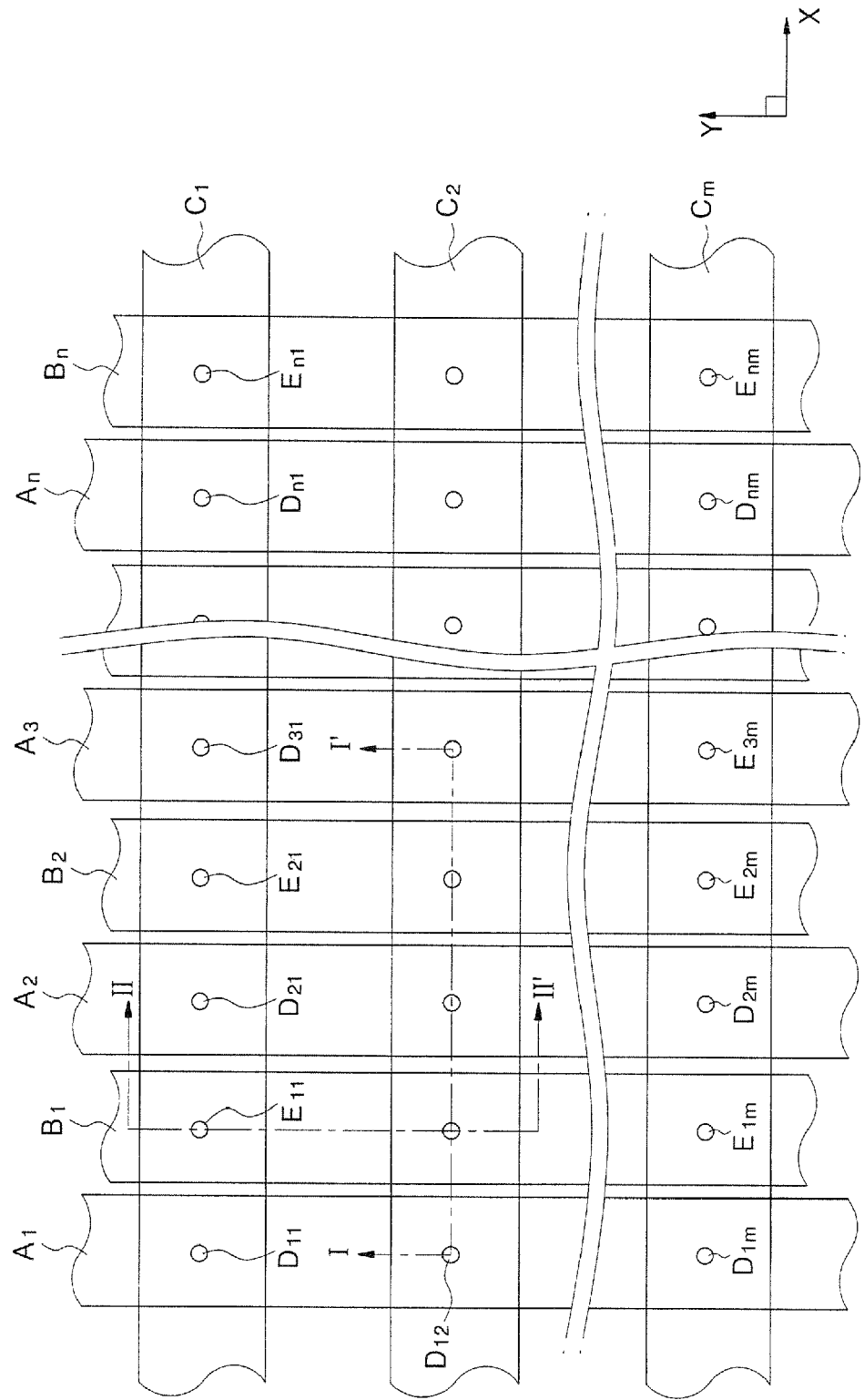
FIG. 1 is a plan view of a storage device according to exemplary embodiments of the present invention.

The inventive principles of this patent disclosure are described more fully hereinafter with reference to the accompanying drawings in which exemplary embodiments of the invention are shown. This inventive principles may, however, be embodied in different forms and should not be construed as limited to the embodiments set forth herein. Rather, these embodiments are provided so that this disclosure is thorough and complete and fully conveys the scope of the inventive principles to those skilled in the art. In the drawings, the thicknesses of layers and regions may be exaggerated for clarity.

FIG. 1 is a plan view of a storage device according to an exemplary embodiment of the present invention, FIGS. 2A through 2I are cross-sectional views illustrating a method of fabricating a probe array according to an exemplary embodiment of the present invention, FIGS. 3A through 3K are cross-sectional views illustrating a method of fabricating a probe array according to another exemplary embodiment of the present invention, and FIGS. 4A through 4G are cross-sectional views illustrating a method of fabricating a probe array according to yet another exemplary embodiment of the present invention. In FIGS. 2A through 2I, 3A through 3K, and 4A through 4G, reference character "PA" refers to a region taken along line I-I' of FIG. 1, and reference character "PB" refers to a region taken along line II-II' of FIG. 1. FIG. 5 is a plan view of a storage device according to another exemplary embodiment of the present invention, and FIGS. 6A through 6F are cross-sectional views of a storage medium according to another exemplary embodiment of the present invention. In FIGS. 6A through 6F, reference character "SA" refers to a region taken along line III-III' of FIG. 5, and "SB" refers to a region taken along line IV-IV' of FIG. 5.

Referring to FIG. 1, the storage device includes first probes and second probes. The first probes are arranged two-dimensionally in rows and columns (i.e., in the X and Y directions). For example, n first probes D11, D21, . . . , Dn1 may be arranged in the X direction, and m first probes D11, D12, . . . , D1$m$ may be arranged in the Y direction. Thus, n×m first probes D11, D21, . . . , and Dnm may be provided.

The second probes may be disposed between the first probes D11, D21, . . . , Dnm arranged in the X direction. That is, n second probes E11, E21, . . . , En1 may be arranged in the X direction, and m second probes E11, E12, . . . , E1$m$ may be arranged in the Y direction. Thus, n×m second probes E11, E21, . . . , Enm may be provided.

In accordance with the inventive principles of this patent disclosure, the first probes D11, D21, . . . , Dmn may be spaced apart from the second probes E11, E21, . . . , Enm by a distance smaller than the resolution limit in a lithography process. Thus, the first probes D11, D21, . . . , ad Dnm and the second probes E11, E21, . . . , Enm may be arranged in a high density pattern.

The first probes may be covered by first metal interconnections arranged in the Y direction. For example, n first metal interconnections A1, A2, . . . , An may be provided in the Y direction. Second metal interconnections may be disposed between the first metal interconnections in the Y direction. For example, n second metal interconnections B1, B2, . . . , Bn covering the second probes may be provided in the Y direction.

The first probes D11, D21, . . . , Dnm and second probes E11, E21, . . . , Enm may constitute a high density probe array. A plurality of lower electrodes may be arranged in the X direction across the first metal interconnections A1, A2, . . . , An and the second metal interconnections B1, B2, . . . , Bn. For example, m lower electrodes C1, C2, . . . , Cm may be arranged in the X direction under the first metal interconnections A1, A2, . . . , An and the second metal interconnections B1, B2, . . . , Bn. Although not shown in FIG. 1, data storage elements may be provided on the lower electrodes C1, C2, . . . , Cm.

Next, a storage device according to another exemplary embodiment of the present invention will be described with reference to FIG. 5. Referring to FIG. 5, the storage device includes first probes, second probes, third probes, and fourth probes. The first probes are arranged two-dimensionally in X and Y directions. For example, n first probes d11, d21, . . . , dn1 may be arranged in the X direction, and m first probes d11, d12, . . . , d1$m$ may be arranged in the Y direction. Thus, n×m first probes d11, d21, . . . , dnm may be provided.

The second probes may be arranged in the X direction and disposed between the first probes d11, d21, . . . , dnm. For example, n second probes e11, e21, . . . , en1 may be arranged in the X direction, and m second probes e11, e12, . . . , e1m may be arranged in the Y direction. Thus, n×m second probes e11, e21, . . . , enm may be provided.

The third probes may be arranged in the Y direction and disposed between the first probes d11, d21, . . . , dnm. For example, m third probes f11, f12, . . . , f1$m$ may be arranged in the Y direction, and n third probes f11, f21, . . . , fn1 may be arranged in the X direction. Thus, n×m third probes f11, f12, . . . , fnm may be provided.

The fourth probes may be arranged in the Y direction and disposed between the second probes e11, e21, . . . , enm. For example, m fourth probes g11, g12, . . . , g1$m$ may be arranged in the Y direction, and n fourth probes g11, g21, ..., gn1 may be arranged in the X direction. Thus, n×m fourth probes g11, g12, ..., gnm may be provided.

In some embodiments of the present invention, the first, second, third, and fourth probes may be spaced apart from adjacent probes by a distance smaller than the resolution limit in a lithography process. Accordingly, the first, second, third, and fourth probes may be arranged at a high density pattern.

First metal interconnections parallel to each other in the Y direction may cover the first probes d11, d21, ..., dmn and the third probes f11, f12, ..., fnm. For instance, n first metal interconnections a1, a2, ..., an may be provided in the Y direction. Additionally, n second metal interconnections b1, b2, ..., bn may be interposed between the first metal interconnections a1, a2, ..., an and arranged in the Y direction. The second metal interconnections b1, b2, ..., bn may cover the second probes e11, e21, ..., enm and the fourth probes g11, g12, ..., gnm. The above-described first, second, third, and fourth probes may constitute a probe array. Thus, the probe array may include the first probes d11, d21, ..., dnm, the second probes e11, e21, ..., enm, the third probes f11, f12, ..., fnm, and the fourth probes g11, g12, ..., gnm that are integrated at a high density level.

Additionally, a plurality of lower electrodes may be provided across the first metal interconnections a1, a2, ..., an and the second metal interconnections b1, b2, ..., bn and arranged in the X direction. For instance, m first lower electrodes Ca1, Ca2, ..., Cam may be arranged in the X direction and m second lower electrodes Cb1, Cb2, ..., Cbm may be interposed between the m first lower electrodes Ca1, Ca2, ..., Cam. The distance between the first lower electrodes Ca1, Ca2, ..., Cam and the second lower electrodes Cb1, Cb2, ..., Cbm may be smaller than the resolution limit in a lithography process. The first lower electrodes Ca1, Ca2, ..., Cam and the second lower electrodes Cb1, Cb2, ..., Cbm may be disposed under the first metal interconnections a1, a2, ..., an and the second metal interconnections b1, b2, ..., bn. Although not shown in FIG. 5, data storage elements may be provided on the first lower electrodes and the second lower electrodes.

A storage device, as described above, may include a high-density probe array, and thus, the storage device may store data at high density levels.

Methods for fabricating a probe array, including the first probes D11, D21, ..., Dnm and the second probes E11, E21, ..., Enm, as illustrated FIG. 1, will now be described.

Figure 2C:
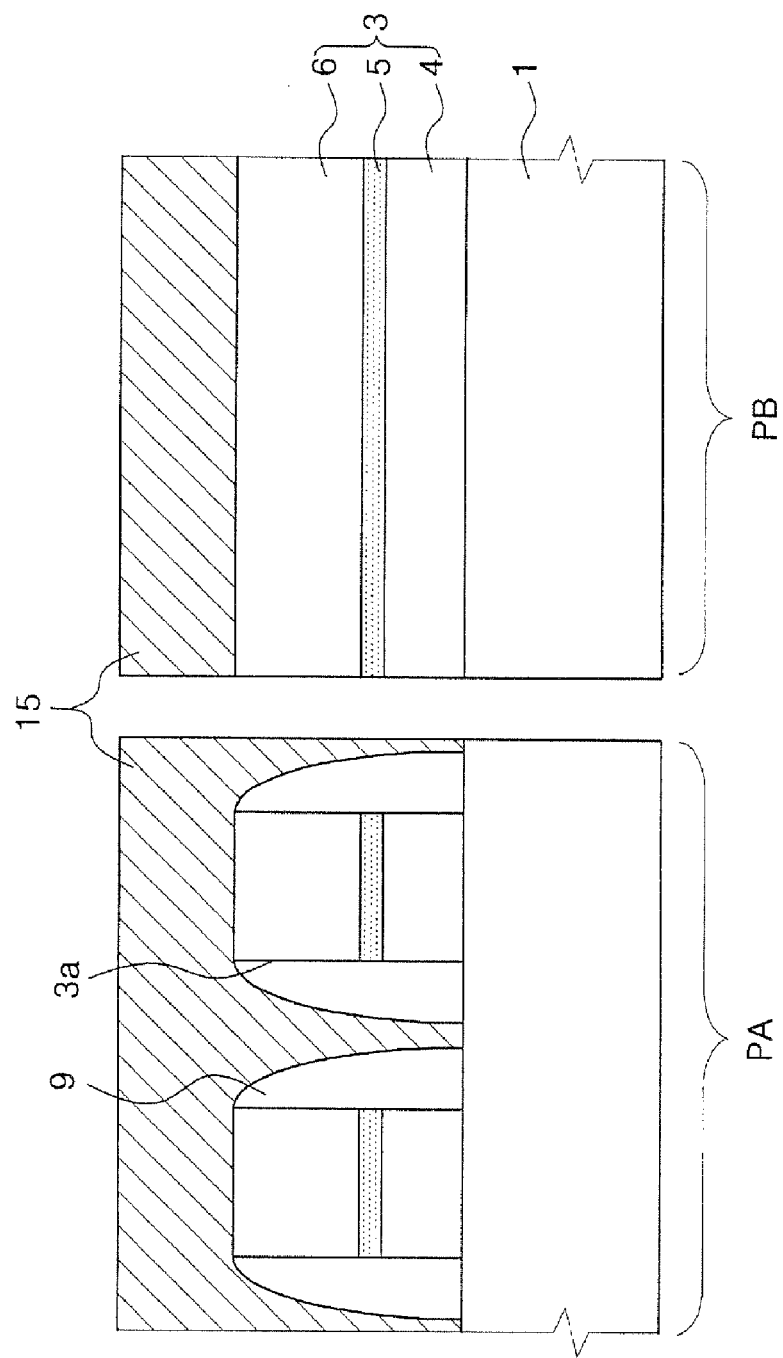

An embodiment of one exemplary method of fabricating a probe array according to the inventive principles of this patent disclosure will be described with reference to FIGS. 1 and 2A through 2I. Referring to FIGS. 1 and 2A, a sacrificial substrate 1 is first prepared. The sacrificial substrate 1 may be formed by sequentially stacking a silicon substrate and a sacrificial insulating layer. The sacrificial insulating layer may be a material layer that may be removed by a wet etching process. For example, the sacrificial insulating layer may be a silicon oxide layer. A first mold insulating layer 3 may be formed on the sacrificial substrate 1. The first mold insulating layer 3 may be formed by sequentially stacking a lower mold insulating layer 4, a planarization stop layer 5, and an upper mold insulating layer 6.

Referring to FIGS. 1 and 2B, the first mold insulating layer 3 may be patterned, thereby forming first holes 3a to expose the sacrificial substrate 1. The first holes 3a may be arranged two-dimensionally in the X and Y directions. First hole spacers 9 may be formed to cover sidewalls of the first holes 3a.

After that, a first conductive layer 15 may be formed on the sacrificial substrate 1 having the first hole spacers 9 as shown in FIG. 2C.

Referring to FIGS. 1 and 2D, the first conductive layer 15 may be planarized. As a result, first probes 16 may be formed in the first holes 3a, the sidewalls of which are covered by the first hole spacers 9. The planarization of the first conductive layer 15 may be performed using a chemical mechanical polishing (CMP) technique until the planarization stop layer 5 is exposed. As a result, the upper mold insulating layer 6 is removed and the first probes 16 are formed. A top surface of each of the first probes 16 may have an area equal to or greater than a bottom surface thereof. A plurality of first probes 16 may be arranged in the X and Y directions. For example, n first probes D11, D21, ..., Dn1 may be arranged in the X direction, and m first probes D11, D12, ..., D1m may be arranged in the Y direction. Thus, n×m first probes 16 may be arranged.

Figure 2F:
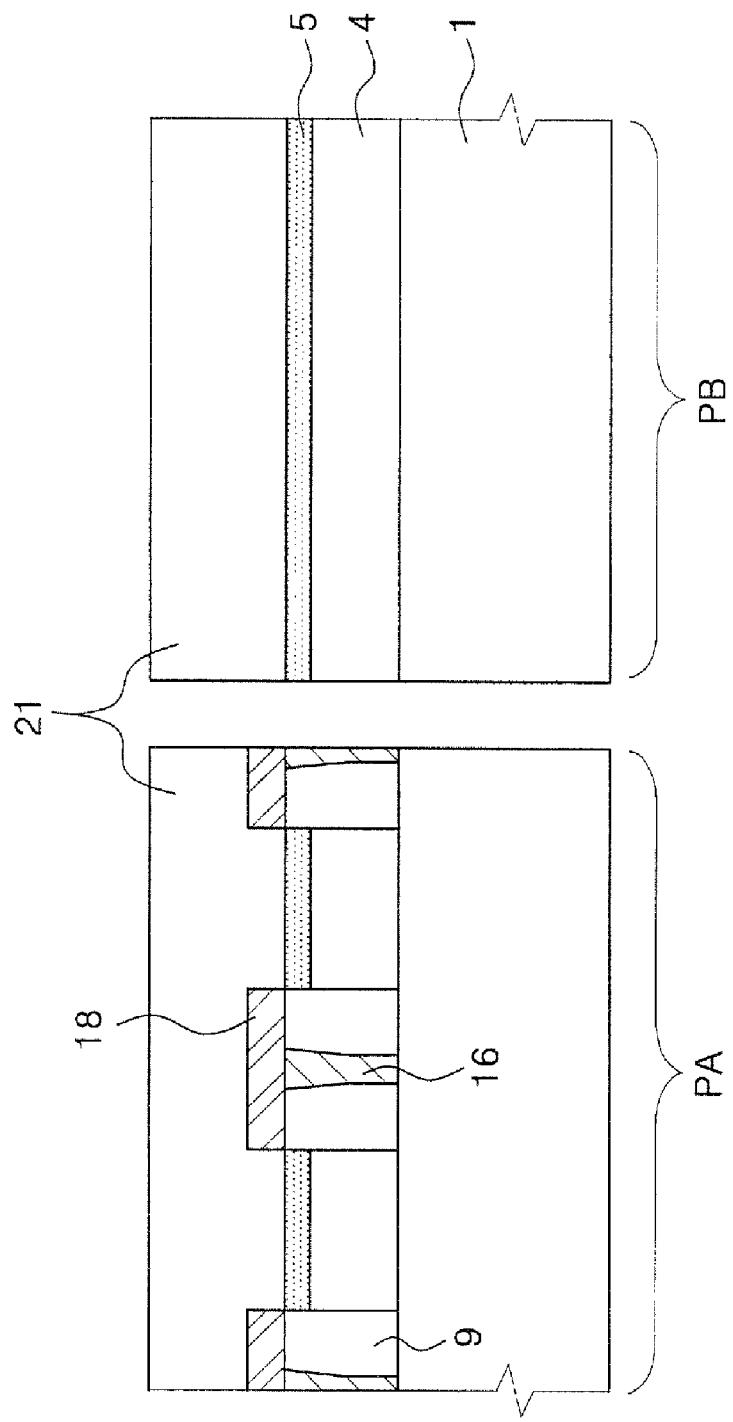
Figure 21:
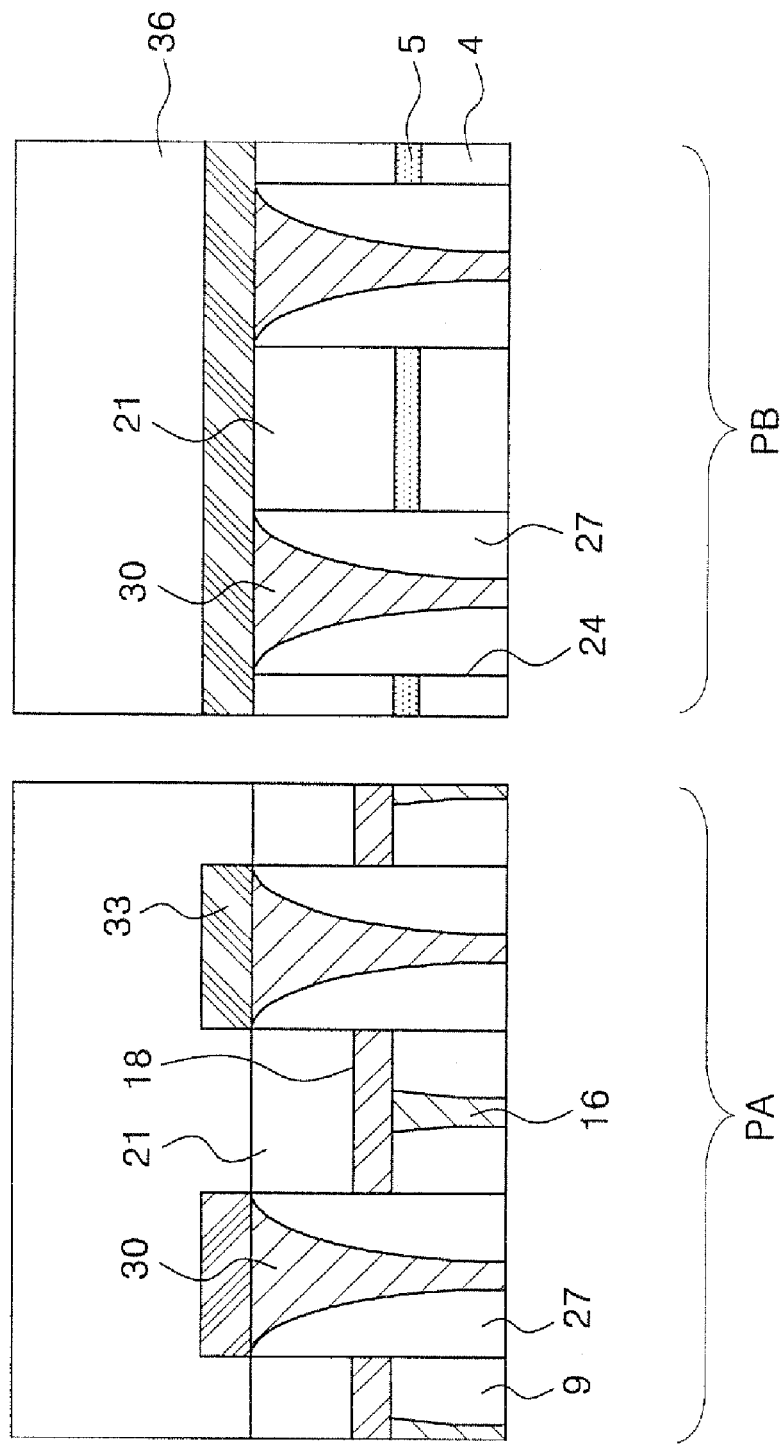

Referring to FIGS. 1 and 2E, first metal interconnections 18 may be formed to cover the first probes 16 in the Y direction. Each of the first metal interconnections 18 may have a width greater than the width of the top surface of each of the first probes 16. After that, a second mold insulating layer 21 may be formed on the sacrificial substrate 1 having the first metal interconnections 18 as shown in FIG. 2F.

Referring to FIGS. 1 and 2G, second holes 24 may be formed through the second mold insulating layer 21, the planarization stop layer 5, and the lower mold insulating layer 4. The second holes 24 may be formed between the first probes 16 arranged in the X direction. Thereafter, second hole spacers 27 may be formed to cover sidewalls of the second holes 24. A second conductive layer may be formed on the sacrificial substrate 1 having the second hole spacers 27 and then planarized until the second mold insulating layer 21 is exposed. As a result, second probes 30 may be formed in the second holes 24 which have sidewalls covered by the second hole spacers 27. A top surface of each of the second probes 30 may have an area equal to or greater than a bottom surface thereof. The distance between the second probes 30 and the first probes 16 may be smaller than the resolution limit in a lithography process.

Second metal interconnections 33 may be formed in the Y direction to cover the second probes 30. The first probes 16 may be formed with a height different from the second probes 30 as shown in FIG. 2G. Also, the second metal interconnections 33 may be formed on a level different from the first metal interconnections 18.

Referring to FIGS. 1 and 2H, a probe substrate 36 may be formed above the sacrificial substrate 1 having the second metal interconnections 33. The probe substrate 36 may be a glass substrate, a silicon substrate or any other suitable substrate. Thereafter, the sacrificial substrate 1 is removed as shown in FIG. 2I, for example, by an etching process. As a result, the sacrificial substrate 1 may be separated from the first and second probes 16 and 30 and the probe substrate 36.

The lower mold insulating layer 4 may be removed during the removal of the sacrificial substrate 1. Also, during the removal of the sacrificial substrate 1, the first and second hole spacers 9 and 27 that surround the first and second probes 16 and 30 may be partially or wholly removed to expose at least lower regions of the first and second probes 16 and 30. Accordingly, since the distance between the first probes 16 and the second probes 30 may be smaller than the resolution limit in a lithography process, highly integrated probes may be obtained.

Figure 3A:
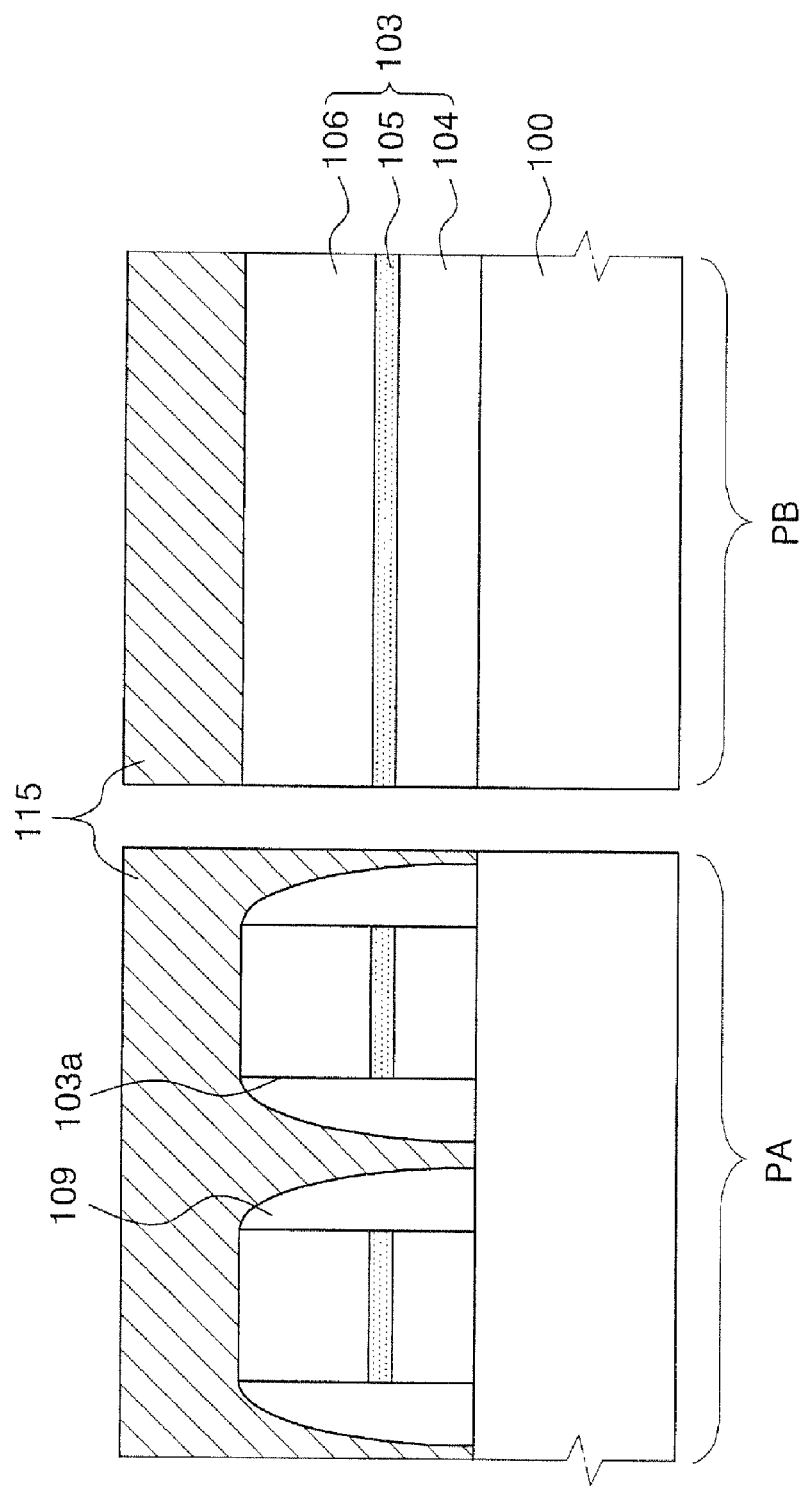
Figure 3C:
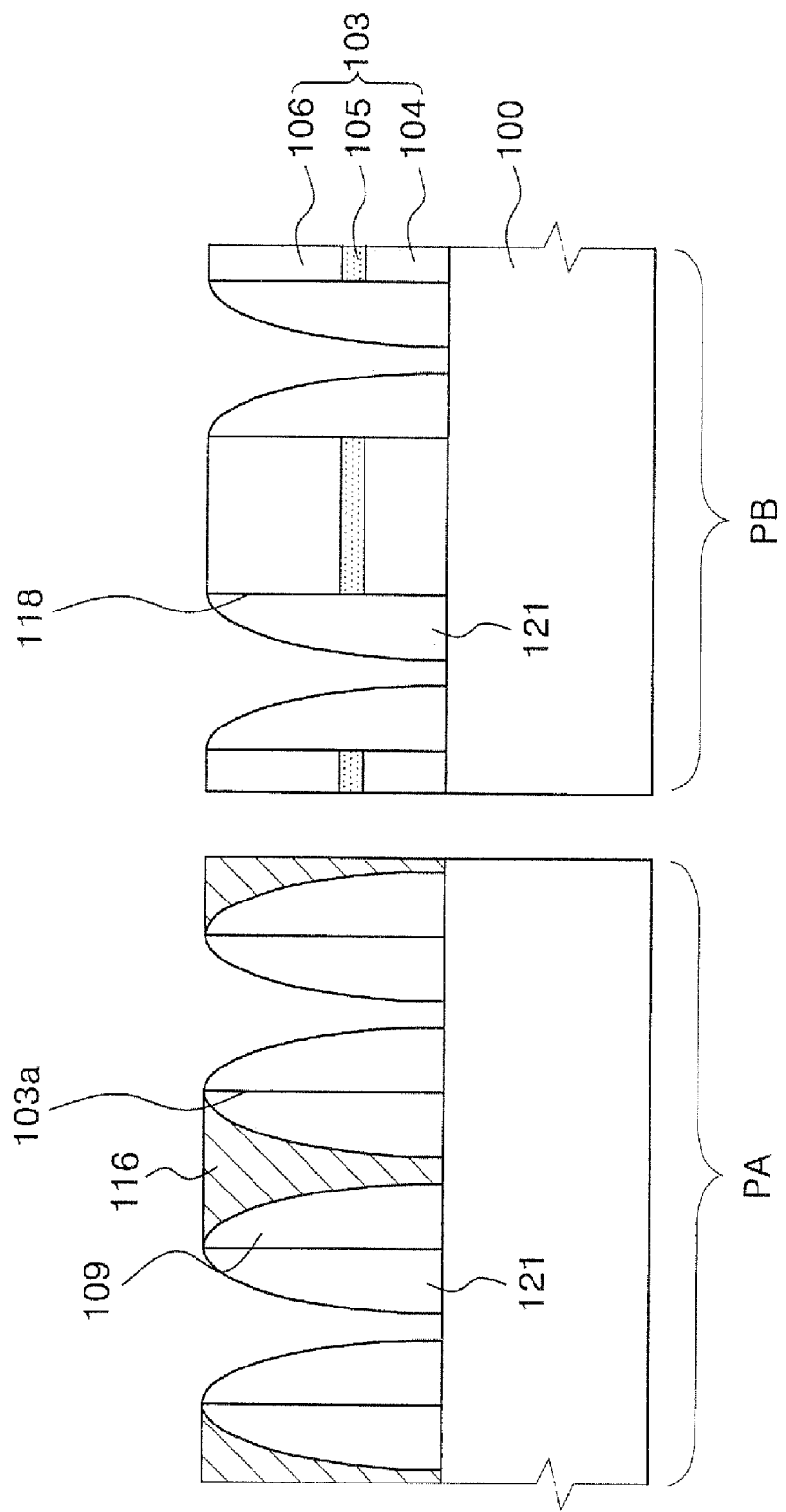

Next, a method of fabricating a probe array according to another exemplary embodiment of the present invention will be described with reference to FIGS. 1 and 3A through 3K. Referring to FIGS. 1 and 3A, a sacrificial substrate 100 is prepared. The sacrificial substrate 100 may be substantially the same as the sacrificial substrate described with reference to FIG. 2A. A mold insulating layer 103 may be formed on the sacrificial substrate 100. The mold insulating layer 103 may be formed by sequentially stacking a lower mold insulating layer 104, a planarization stop layer 105, and an upper mold insulating layer 106. The mold insulating layer 103 may be patterned, thereby forming first holes 103a to expose the sacrificial substrate 100. The first holes 103a may be arranged two-dimensionally in X and Y directions. First hole spacers 109 may be formed to cover sidewalls of the first holes 103a. A first conductive layer 115 may be formed on the sacrificial substrate 100 having the first hole spacers 109. Thereafter, as shown in FIG. 3B, the first conductive layer 115 may be planarized until a top surface of the mold insulating layer 103 is exposed, thereby resulting in formation of first probes 116. For example, n×m first probes 116 may be arranged in the X and Y directions in the same manner as described with reference to FIGS. 1 and 2D.

Referring to 1 and 3C, the mold insulating layer 103 may be patterned, thereby forming second holes 118 between the first probes 116 arranged in the X direction. Second hole spacers 121 may be formed to cover sidewalls of the second holes 118. Thereafter, a second conductive layer 124 may be formed on the sacrificial substrate 100 having the second hole spacers 121 as shown in FIG. 3D.

Figure 3E:
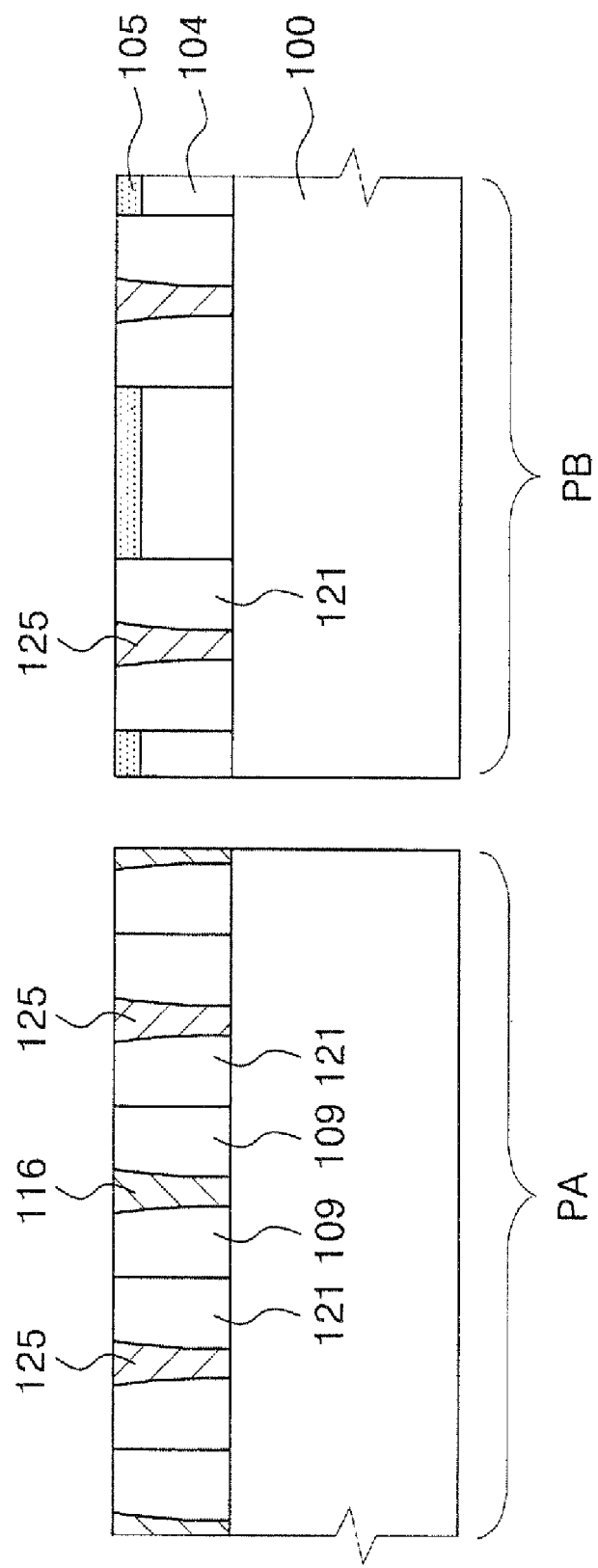

Referring to FIGS. 1 and 3E, the second conductive layer 124 may be planarized. Specifically, the second conductive layer 124 may be planarized by a CMP technique until the planarization stop layer 105 is exposed. Thus, the upper mold insulating layer 106 may be removed during the planarization of the second conductive layer 124. As a result, the second conductive layer 124 may be left as second probes 125 that are surrounded by the second hole spacers 121. A portion of the first probes 116 may also be removed in the process, thereby shortening the height of the first probe 116, which may be surrounded by the first hole spacers 109. The first probes 116 may be formed to the same height as the second probes 125.

Figure 3F:
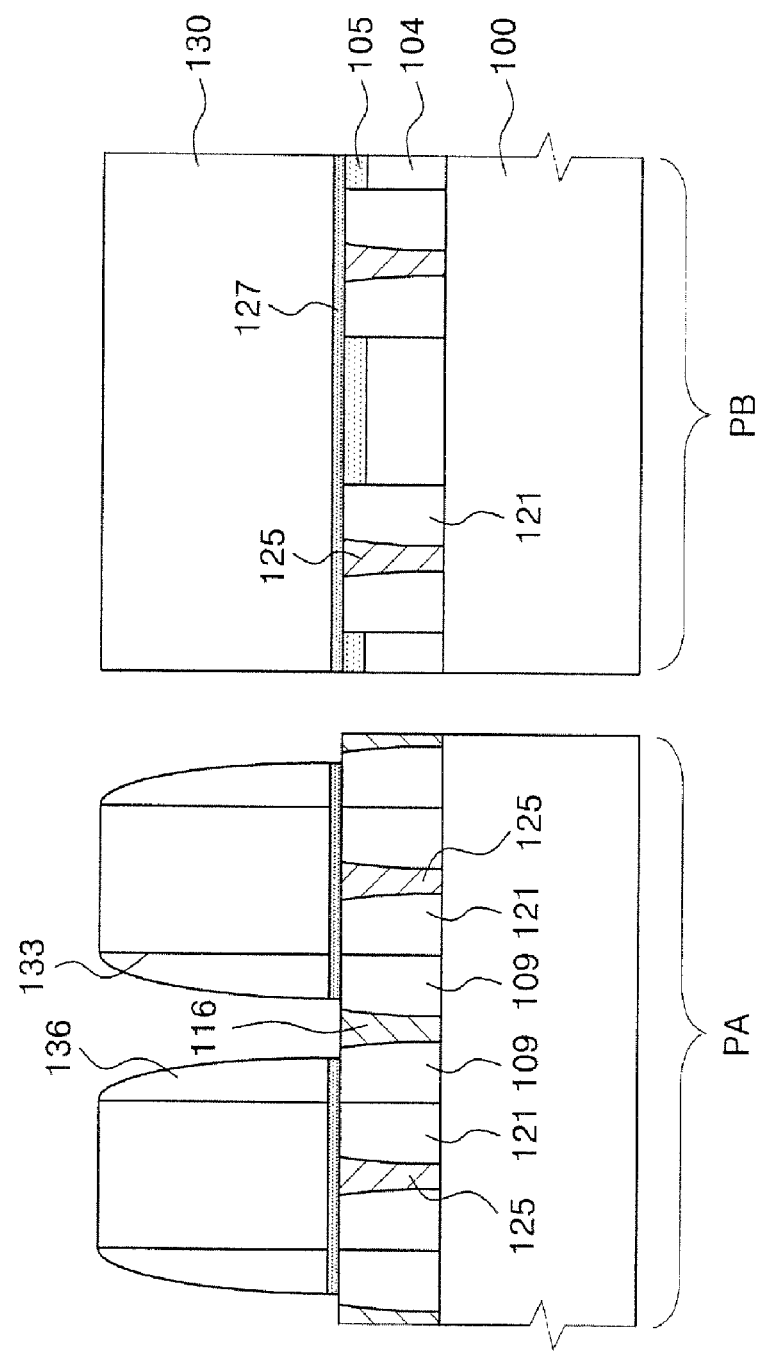

Referring to FIGS. 1 and 3F, an intermetal dielectric layer 130 may be formed on the sacrificial substrate 100 having the first and second probes 116 and 125. The intermetal dielectric layer 130 may be patterned, thereby forming first grooves 133 to expose the first probes 116 arranged in the Y direction. Thereafter, first groove spacers 136 may be formed to cover sidewalls of the first grooves 133. An etch stop layer 127 may be formed before the intermetal dielectric layer 130 is formed. The etch stop layer 127 may be etched during the formation of the first groove spacers 136 such that the first probes 116 are exposed.

Referring to FIGS. 1 and 3G, a first metal layer may be formed on the sacrificial substrate 100 having the first groove spacers 136 and then planarized until the intermetal dielectric layer 130 is exposed. As a result, first metal interconnections 139 may be formed in the first grooves 133, the sidewalls of which are covered by the first groove spacers 136. Accordingly, the first interconnections 139 may cover the first probes 116 arranged in the Y direction.

Figure 3H:
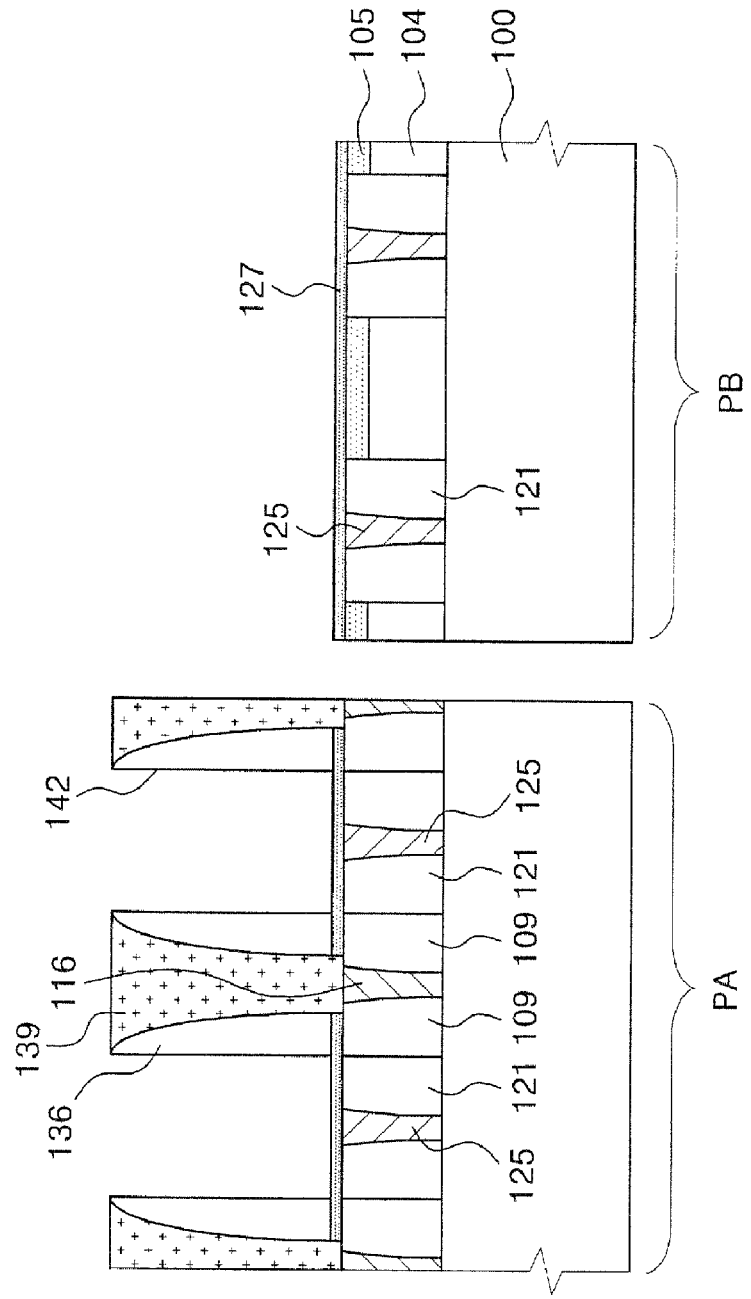

Referring to FIGS. 1 and 3H, the intermetal dielectric layer 130 may be patterned, thereby forming second grooves 142 between the first interconnections 139. The etch stop layer 127 may be exposed by the second grooves 142.

Figure 3I:
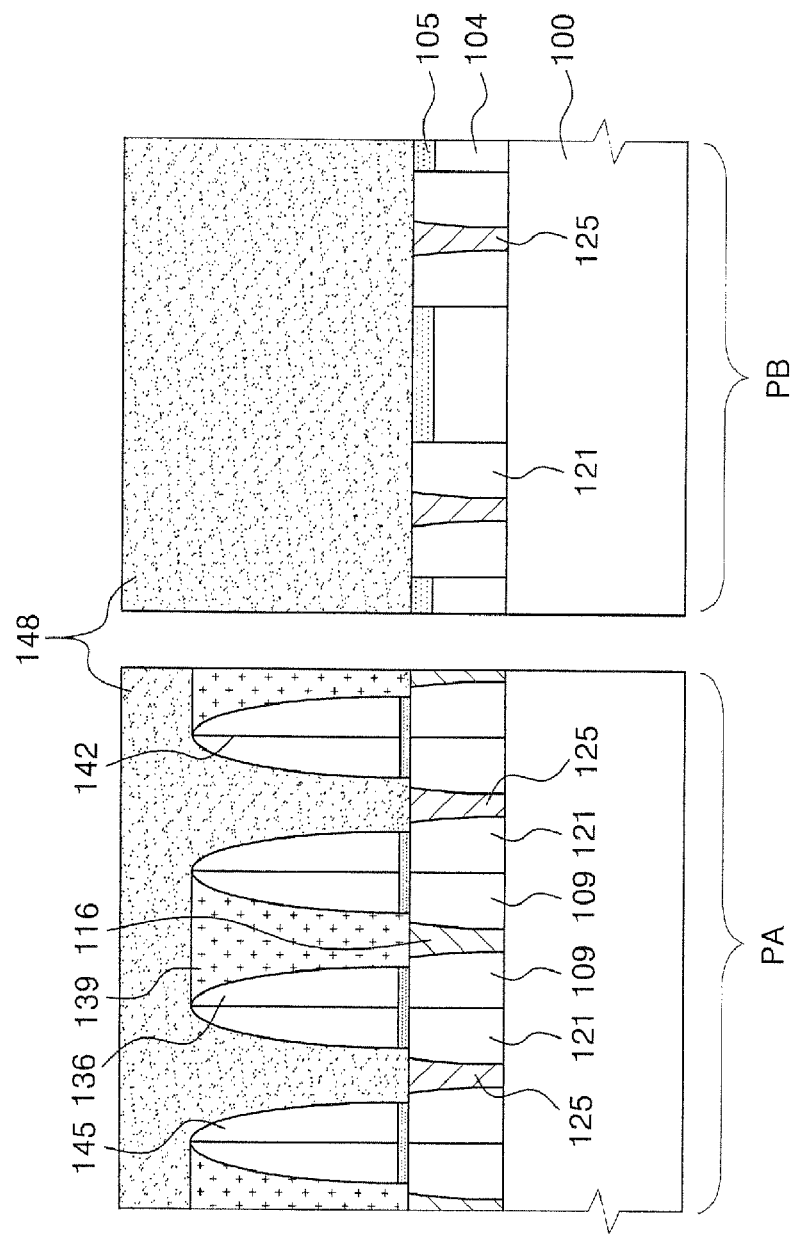

Referring to FIGS. 1 and 3I, second groove spacers 145 may be formed to cover sidewalls of the second grooves 142. The etch stop layer 127 may also be etched during the formation of the second groove spacers 145 so that the second probes 125 may be exposed. After that, a second metal layer 148 may be formed on the sacrificial substrate 100 having the second groove spacers 145.

Referring to FIGS. 1 and 3J, the second metal layer 148 may be planarized to form second metal interconnections 149. In order to prevent short circuiting between the first metal interconnections 139 and the second metal interconnections 149, the second metal layer 148 may be planarized until upper regions of the first and second groove spacers 136 and 145 are removed. As a result, the first metal interconnections 139 may be spaced apart from the second metal interconnections 149 as shown in FIG. 3J. The distance between the first metal interconnections 139 and the second metal interconnections 149 may be smaller than the resolution limit in a lithography process.

Figure 3K:
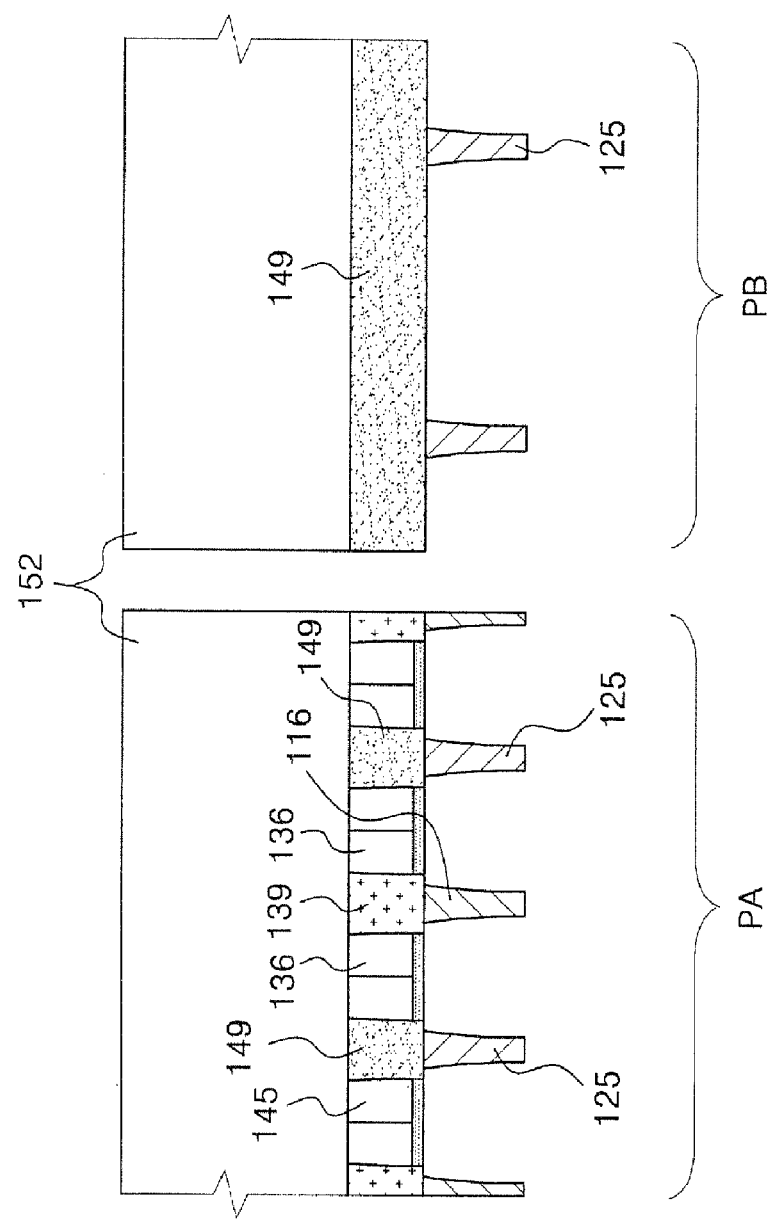

Referring to FIGS. 1 and 3K, a probe substrate 152 may be formed above the sacrificial substrate 100 having the first and second metal interconnections 139 and 149. Thereafter, the sacrificial substrate 100 may be removed. The lower mold insulating layer 104 may be removed during the removal of the sacrificial substrate 100. Further, the first and second hole spacers 109 and 121 may be removed during or after the removal of the sacrificial substrate 100. As a result, the first and second probes 116 and 125 may be exposed as shown in FIG. 3K. That is, the first and second probes 116 and 125 may protrude downward from the probe substrate 152.

Figure 4B:
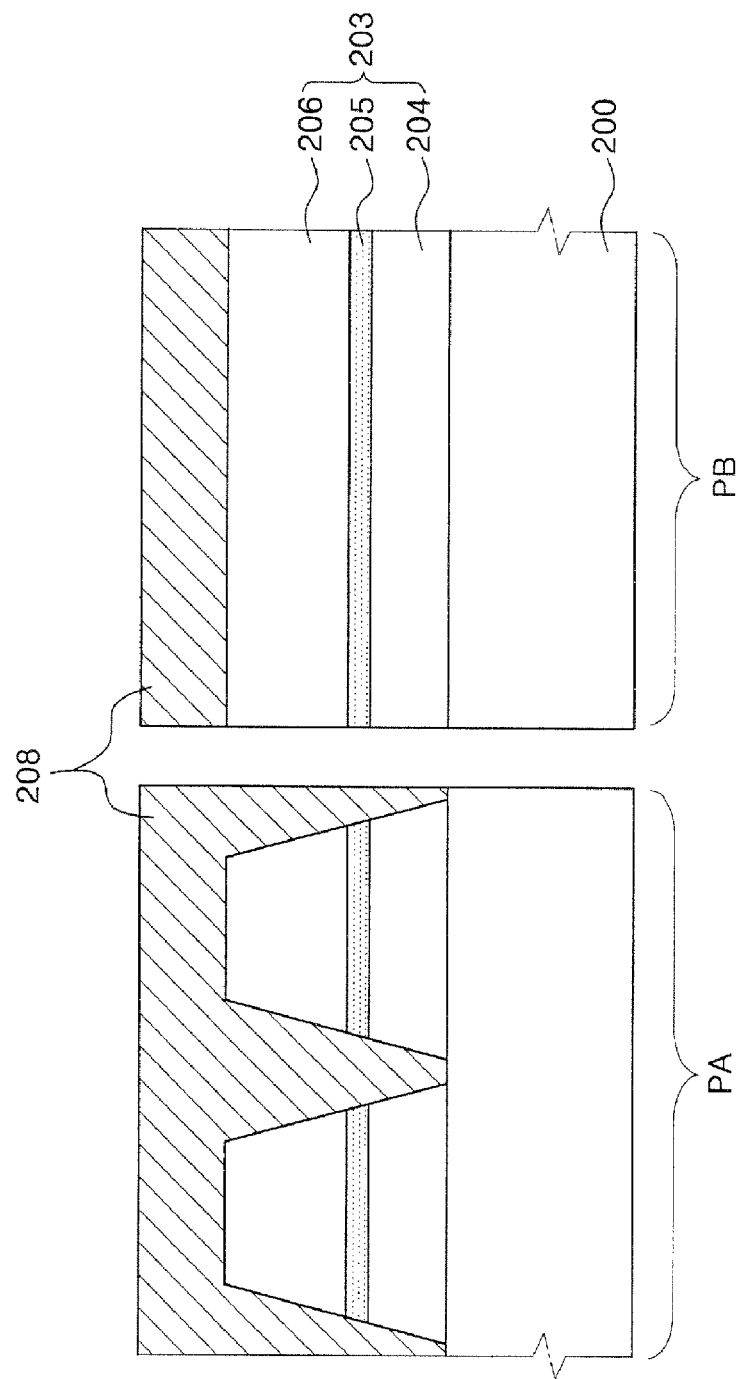

Hereinafter, a method of fabricating a probe array according to yet another exemplary embodiment of the present invention will now be described with reference to FIGS. 1 and 4A through 4G. Referring to FIGS. 1 and 4A, a sacrificial substrate 200 is prepared. The sacrificial substrate 200 may be substantially the same as described with reference to FIG. 2A. A mold insulating layer 203 may be formed on the sacrificial substrate 200. The mold insulating layer 203 may be formed by sequentially forming a lower mold insulating layer 204, a planarization stop layer 205, and an upper mold insulating layer 206.

The mold insulating layer 203 may be patterned, thereby forming first holes 203a arranged two-dimensionally in X and Y directions. In this case, a bottom surface of each of the first holes 203a may be narrower than a top surface thereof. After that, a first conductive layer 208 may be formed on the sacrificial substrate 200 having the first holes 203a as shown in FIG. 4B. Subsequently, the first conductive layer 208 may be planarized until the mold insulating layer 203 is exposed as shown in FIG. 4C. As a result, first probes 209 are formed. The n×m first probes 209 may be arranged in the X and Y directions in the same manner as described with reference to FIGS. 1 and 2D.

Figure 4D:
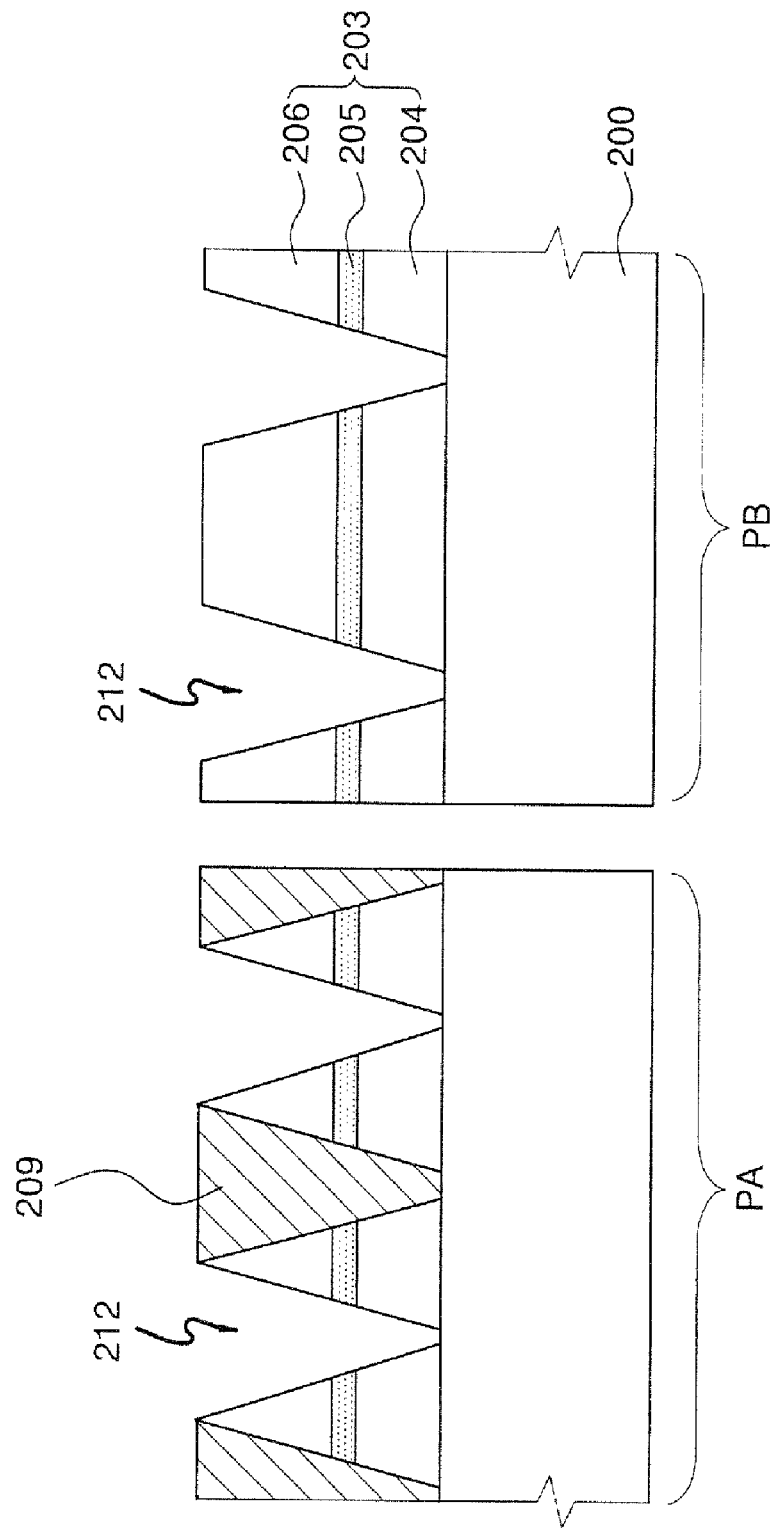

Referring to FIGS. 1 and 4D, the mold insulating layer 203 may be patterned, thereby forming second holes 212 between the first probes 209 arranged in the X direction. A bottom surface of each of the second holes 212 may be narrower than a top surface thereof.

Referring to FIGS. 1 and 4E, a second conductive layer 215 may be formed on the sacrificial substrate 200 having the second holes 212.

Figure 4F:
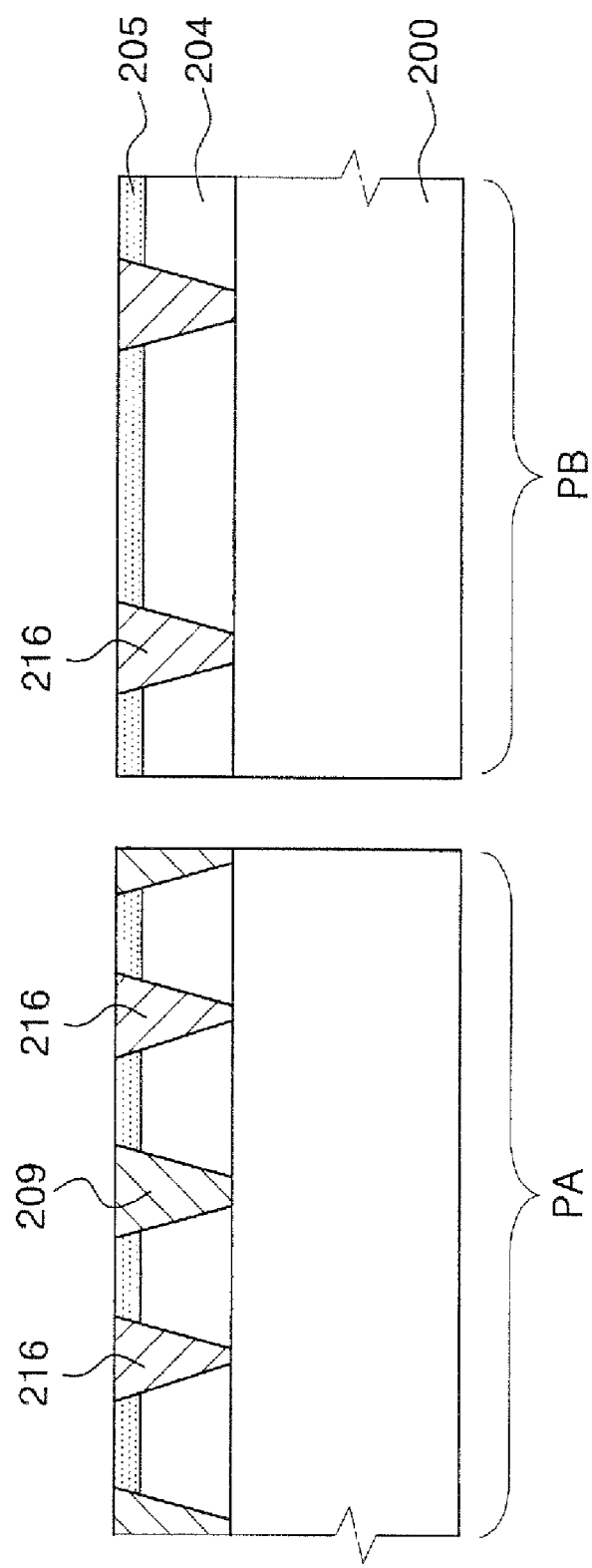

Referring to FIGS. 1 and 4F, the second conductive layer 215 of FIG. 4E may be planarized until the planarization stop layer 205 is exposed, so that second probes 216 left in the second holes 212 are formed. The upper mold insulating layer 206 may be removed during the planarization of the second conductive layer, and thus the height of the first probes 209 may be reduced. As a result, the first probes 209 may be formed to the same height as the second probes 216. The bottom surface of each of the first and second probes 209 and 216 may be narrower than the top surface thereof.

Figure 4G:
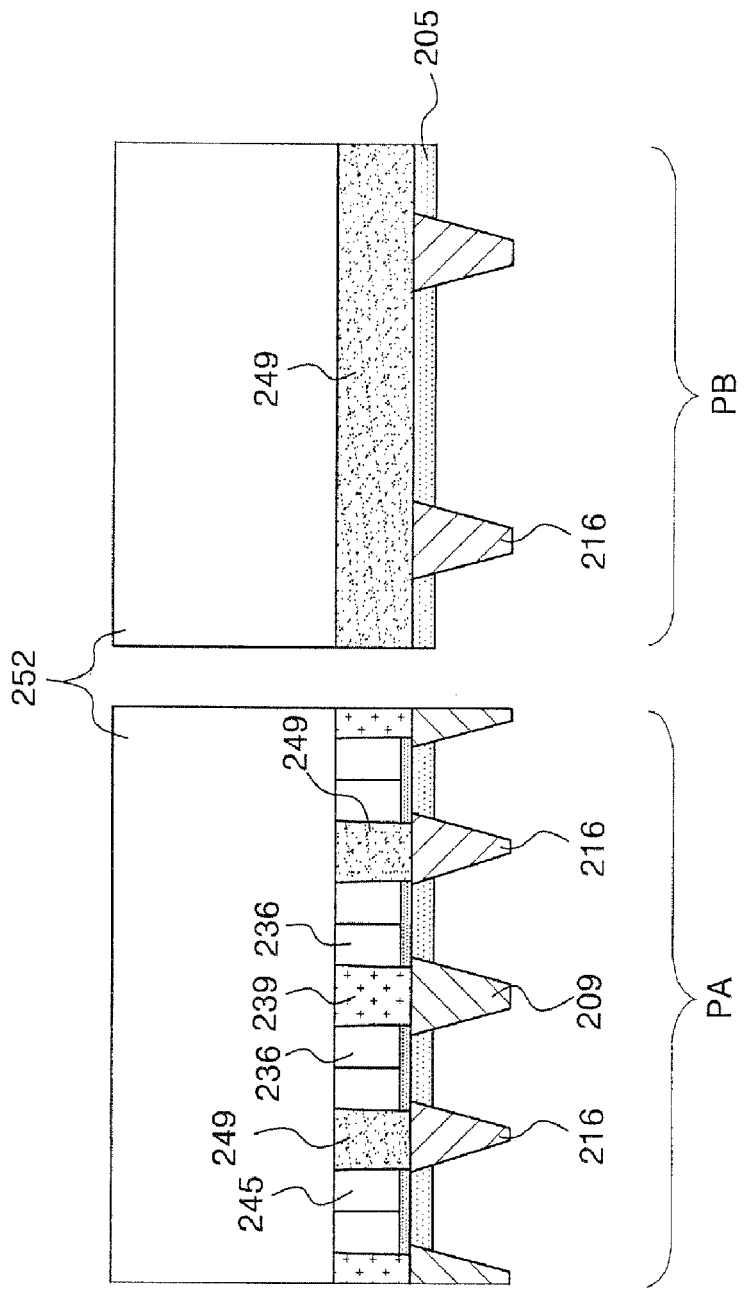

Referring to FIGS. 1 and 4G, first metal interconnections 239 may be formed to cover the first probes 209 arranged in the Y direction. Thereafter, second metal interconnections 249 may be formed between the first metal interconnections 239 to cover the second probes 216 arranged in the Y direction. The first and second metal interconnections 239 and 249 may be surrounded by first and second groove spacers 236 and 245, respectively. The first and second metal interconnections 239 and 249 may be formed by the same method for forming the metal interconnections 139 and 149 as described with reference to FIGS. 3F through 3K. The first groove spacers 136, the second groove spacers 145, the first metal interconnections 139, and the second metal interconnections 149 shown in FIG. 3K may correspond to the first groove spacers 236, the second groove spacers 245, the first metal interconnections 239, and the second metal interconnections 249 of FIG. 4G, respectively.

A probe substrate 252 may be disposed above the sacrificial substrate 200 having the first and second metal interconnections 239 and 249. Thereafter, the sacrificial substrate 200 may be removed. The lower mold insulating layer 204 may be removed during the removal of the sacrificial substrate 200. Alternatively, the lower mold insulating layer 204 may be removed after the removal of the sacrificial substrate 200. As a result, the first probes 209 and the second probes 216 may protrude downward from the probe substrate 252.

The probe array including the first probes d11, d21, . . . , dnm, the second probes e11, e21, . . . , enm, the third probes f11, f12, . . . , fnm, the fourth probes g11, g12, . . . , gnm, the first metal interconnections a1, a2, . . . , an, and the second metal interconnections b1, b2, . . . , bn described with reference to FIG. 5 may be easily fabricated by the exemplary methods described with reference to FIGS. 1, 3A through 3K and 4A through 4G. In other words, the processes performed until the first probes d11, d21, . . . , dnm and the second probes e11, e21, . . . , enm are formed as shown in FIG. 1 may be substantially the same as that described with reference to FIGS. 3A through 4G.

For example, after the first probes d11, d21, . . . , dnm and the second probes e11, e21, . . . , enm are formed using the method described with reference to FIGS. 3A through 3E, the third probes f11, f12, . . . , fnm and the fourth probes g11, g12, . . . , gnm may be formed by repeating the same method. That is, the third probes and the fourth probes may be formed by substantially the same method as the method of forming the first probes d11, d21, . . . , dnm and the second probes e11, e21, . . . , enm, except that the third probes f11, f12, . . . , fnm and the fourth probes g11, g12, . . . , gnm are disposed between the first probes d11, d21, . . . , dnm and the second probes e11, e21, . . . , enm are arranged in the Y direction. Also, the first metal interconnections a1, a2, . . . , an and the second metal interconnections b1, b2, . . . , bn may be formed in the same manner as described with reference to FIGS. 3F through 3J.

After the first probes d11, d21, . . . , dnm, the second probes e11, e21, . . . , enm, the third probes f11, f12, . . . , fnm, the fourth probes g11, g12, . . . , gnm, the first metal interconnections a1, a2, . . . , an, and the second metal interconnections b1, b2, . . . , bn shown in FIG. 5 are formed by the above-described methods, a probe substrate may be formed in the same manner as described with reference to FIG. 3K. Accordingly, a detailed description of a method of fabricating the probe array will be omitted here.

Figure 6C:
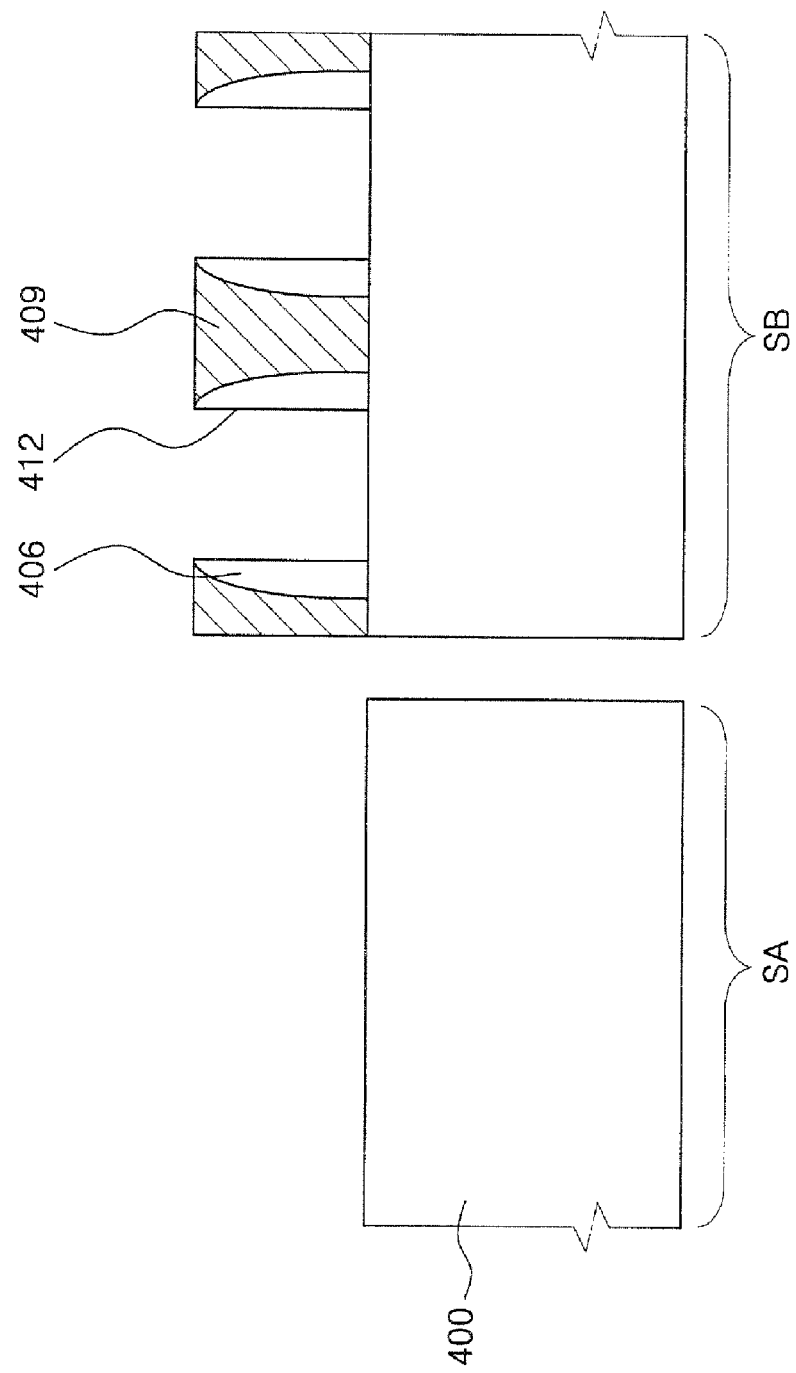

Exemplary methods of fabricating a storage medium according to the inventive principles of this patent disclosure will now be described with reference to FIGS. 5 and 6A through 6F. Referring to FIGS. 5 and 6A, a storage substrate 400 is prepared. For example, the storage substrate 400 may be a silicon substrate having an insulated surface. A mold insulating layer 403 may be formed on the storage substrate 400. The mold insulating layer 403 may be patterned, thereby forming a plurality of first grooves 403a. For example, m first grooves 403a may be formed in the X direction. First groove spacers 406 may be formed to cover sidewalls of the first grooves 403a.

Referring to FIGS. 5 and 6B, a first conductive layer may be formed on the storage substrate 400 having the first groove spacers 406, and then planarized until a top surface of the mold insulating layer 403 is exposed. As a result, first lower electrodes 409 may be formed. Subsequently, the mold insulating layer 403 may be patterned, thereby forming second grooves 412 between the first lower electrodes 409 as shown in FIG. 6C.

Figure 6D:
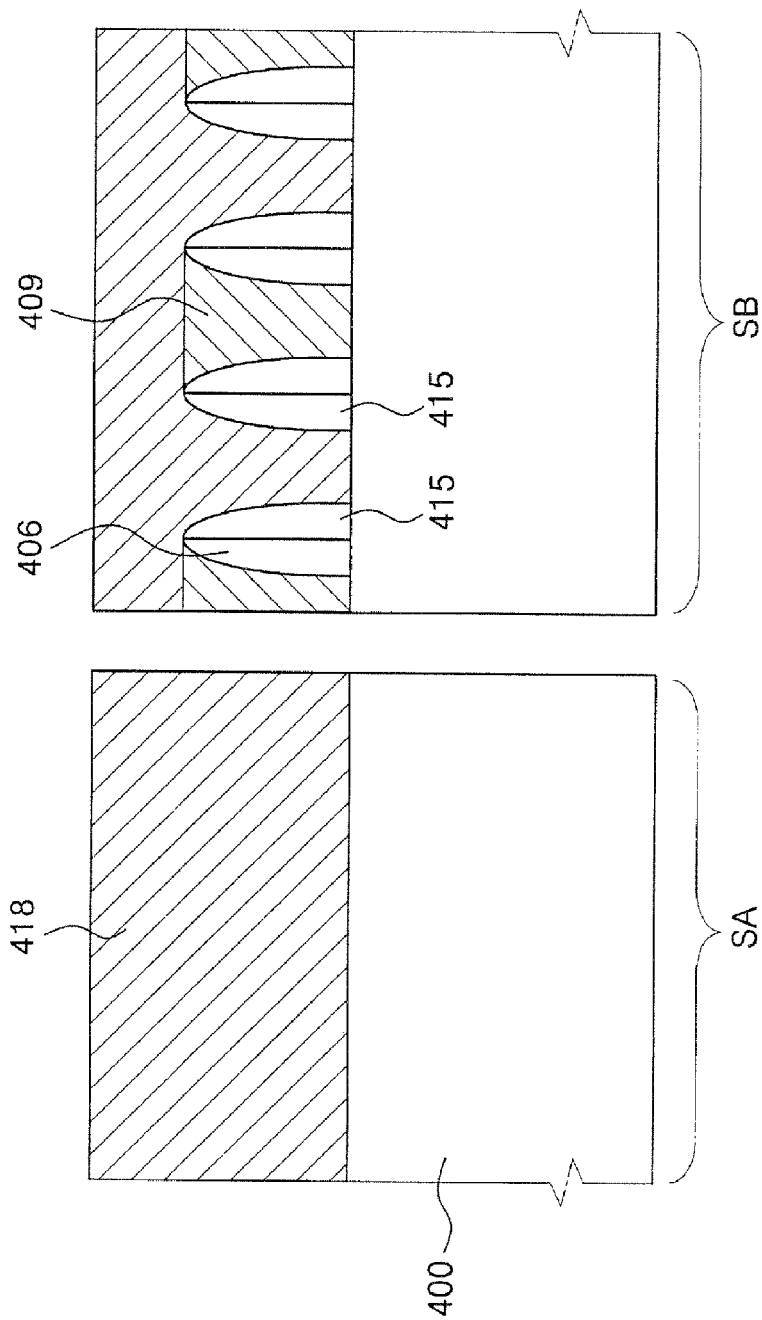

Referring to FIGS. 5 and 6D, second groove spacers 415 may be formed to cover sidewalls of the second grooves 412. After that, a second conductive layer 418 may be formed on the storage substrate 400 having the second groove spacers 415. Subsequently, the second conductive layer 418 may be planarized to form second lower electrodes 419 as shown in FIG. 6E. Here, the second conductive layer 418 may be planarized until upper regions of the first and second groove spacers 406 and 415 are removed. As a result, short circuiting between the first and second lower electrodes 409 and 419 may be prevented. Accordingly, the distance between the first and second lower electrodes 409 and 419 may be smaller than the resolution limit in a lithography process.

Figure 6F:
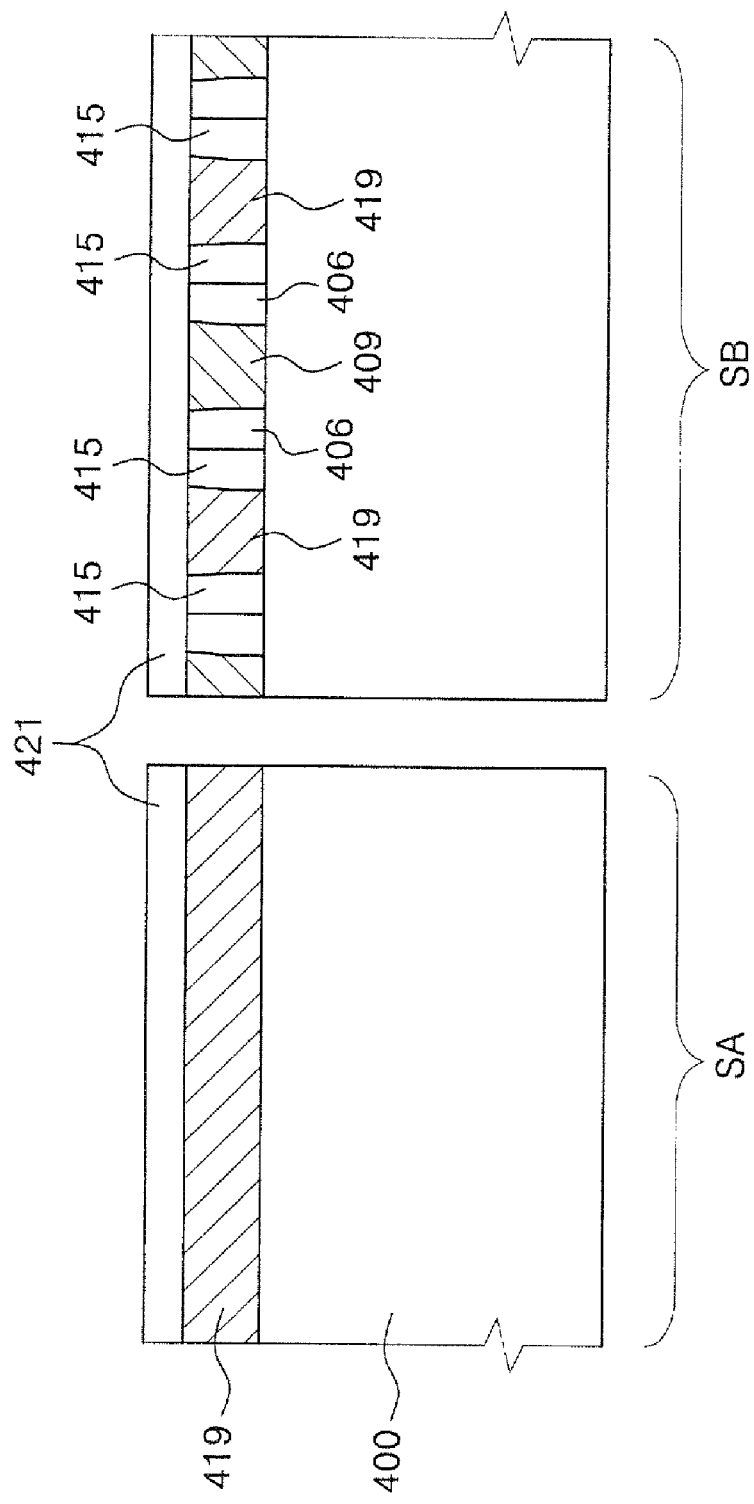

Referring to FIGS. 5 and 6F, a data storage element 421 may be formed on the storage substrate 400 having the first and second lower electrodes 409 and 419. The data storage element 421 may be formed from a ferroelectric material, a resistance memory material, a polymer or any other suitable material. The data storage element 421 may be formed in self-alignment with the first and second lower electrodes 409 and 419. For instance, after the second conductive layer 418 is planarized using a CMP technique to expose top surfaces of the groove spacers 406 and 415, and the lower electrodes 409 and 419 are etched using an etchback process to expose intermediate regions of the groove spacers 406 and 415, the data storage element 421 may be selectively formed on the lower electrodes 409 and 419. In other words, the data storage element 421 may be formed such that the data storage element 421 has a lower top surface than the top surfaces of the groove spacers 406 and 415.

The lower electrodes C1, C2, . . . , Cm shown in FIG. 1 may be formed in the same manner as described with reference to FIGS. 5 and 6A through 6F. Thus, the method of forming the second lower electrodes 419 is omitted from the methods described with reference to FIGS. 6A through 6F. Therefore, since a method of fabricating a storage medium including the lower electrodes C1, C2, . . . , Cm shown in FIG. 1 may be easily inferred from the methods described with reference to FIGS. 5 and 6A through 6F, a detailed description thereof will be omitted here.

A variety of methods for fabricating probe arrays and storage mediums according to the inventive principles of this patent disclosure have been explained so far. Now, embodiments of probe array structures fabricated according to the inventive principles of this patent disclosure will be described.

First, an exemplary embodiment of a probe array structure will be described with reference to FIGS. 1 and 2I. Referring to FIGS. 1 and 2I, first probes 16 and second probes 30 are provided under a probe substrate 36. The first and second probes 16 and 30 are arranged two-dimensionally as in FIG.

1. The first probes 16 may have a different height from the second probes 30. For example, the second probes 30 may have a second height greater than the first height of first probes 16. In this embodiment, the first and second probes 16 and 30 may form a planar bottom surface.

First metal interconnections 18 may be disposed between the first probes 16 and the probe substrate 36, and second metal interconnections 33 may be disposed between the second probes 30 and the probe substrate 36. The second metal interconnections 33 may be on a higher level than the first metal interconnections 18. A second mold insulating layer 21 may be interposed between the first metal interconnections 18 and the probe substrate 36.

Next, another exemplary embodiment of a probe array structure according to the inventive principles of this patent disclosure will be described with reference to FIGS. 1 and 3K.

Referring to FIGS. 1 and 3K, first probes 116 and second probes 125 are arranged under a probe substrate 152. The first and second probes 116 and 125 are arranged two-dimensionally as shown in FIG. 1. First metal interconnections 139 may be disposed between the first probes 116 and the probe substrate 152, and second metal interconnections 149 may be disposed between the second probes 125 and the probe substrate 152. The distance between the first and second metal interconnections 139 and 149 may be smaller than the resolution limit in a lithography process. Third probes may be disposed between the first probes 116 arranged in the Y direction, and fourth probes may be disposed between the second probes 125 arranged in the Y direction. As a result, a probe array including the probes described with reference to FIG. 5 may be formed.

Next, a storage medium according to an exemplary embodiment of the present invention will be described with reference to FIGS. 5 and 6F. Referring to FIGS. 5 and 6F, a plurality of first lower electrodes 409 may be disposed on a storage substrate 400. Second lower electrodes 419 may be disposed between the first lower electrodes 409. Since the first and second lower electrodes 409 and 419 were described in detail with reference to FIG. 5, a detailed description thereof will not be presented here.

Next, a storage device assembly and an exemplary method of reading/writing data to/from a storage device according to the inventive principles of this patent disclosure will be described with reference to FIGS. 7, 8A and 8B, and 9A through 9D.

Figure 7:
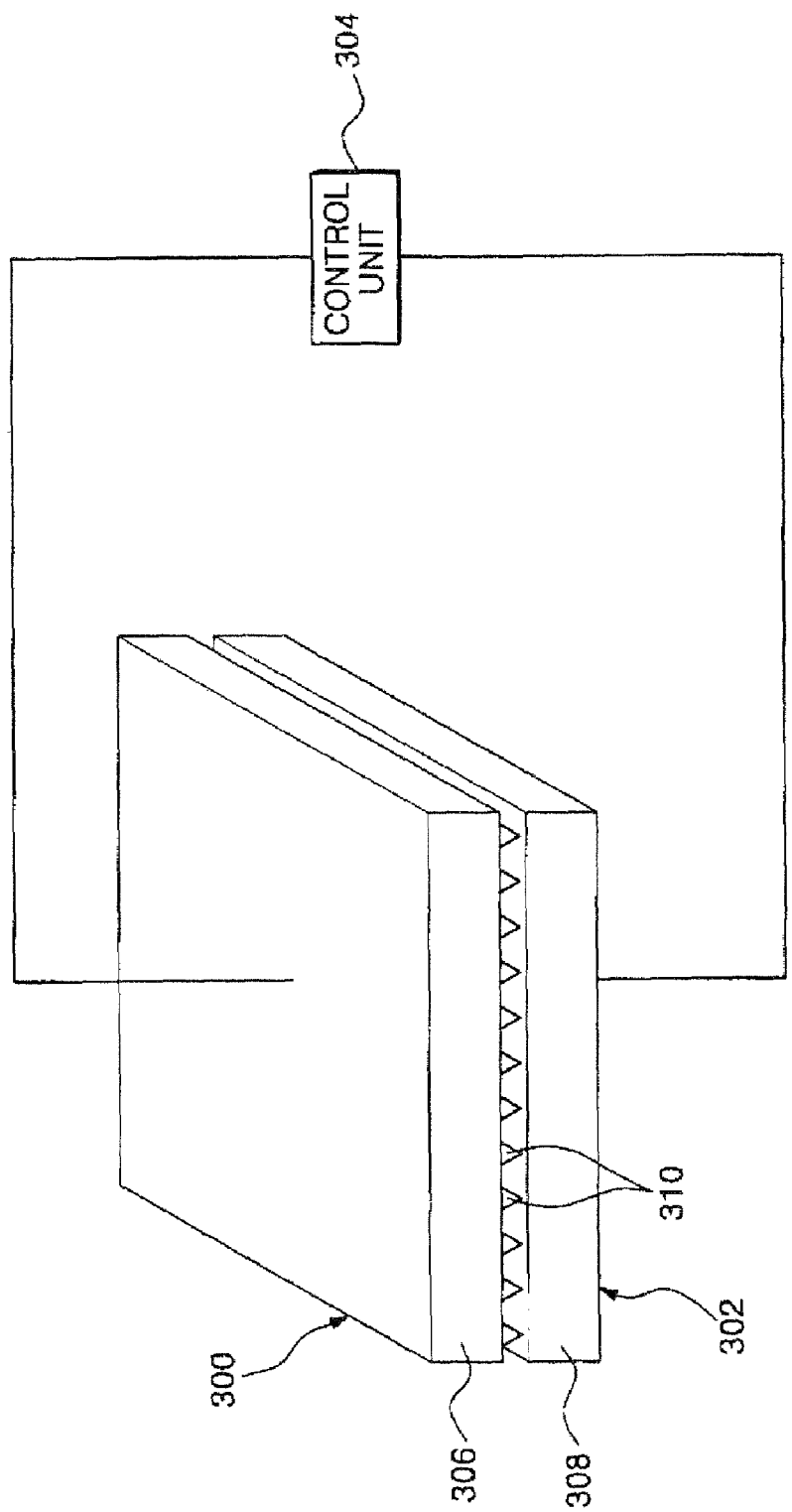
FIG. 7 illustrates the layout of a storage device assembly according to exemplary embodiments of the present invention.
Figure 8A:
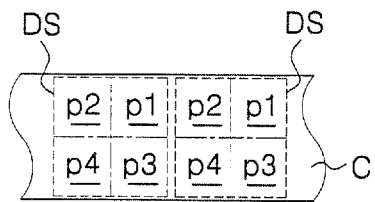
FIG. 8A is an enlarged view of a portion of a storage medium according to exemplary embodiments of the present invention.
Figure 8B:
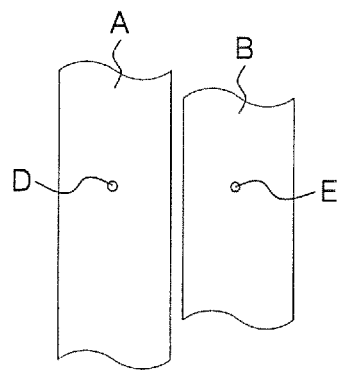
FIG. 8B is an enlarged view of a portion of a probe array according to exemplary embodiments of the present invention.
Figure 9A:
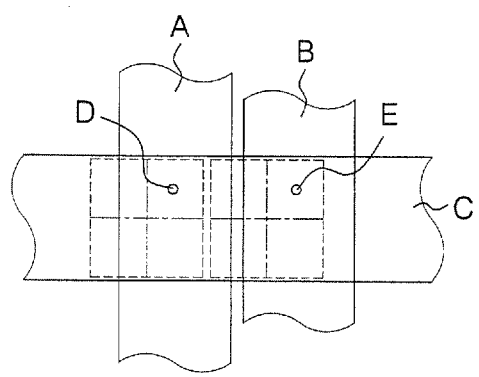
FIGS. 9A through 9D are plan views illustrating a method of reading/writing data according to exemplary embodiments of the present invention.
Figure 9B:
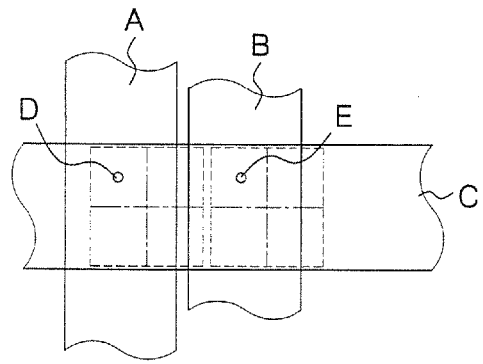
Figure 9C:
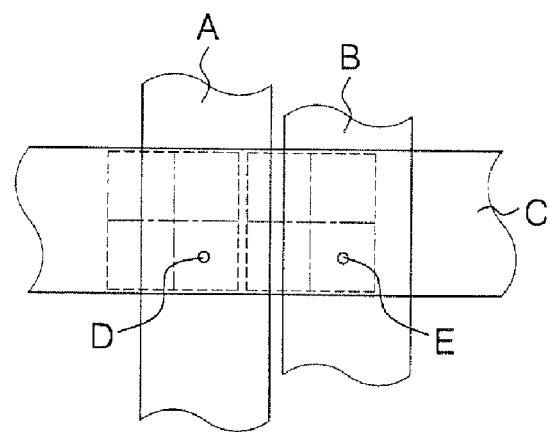
Figure 9D:
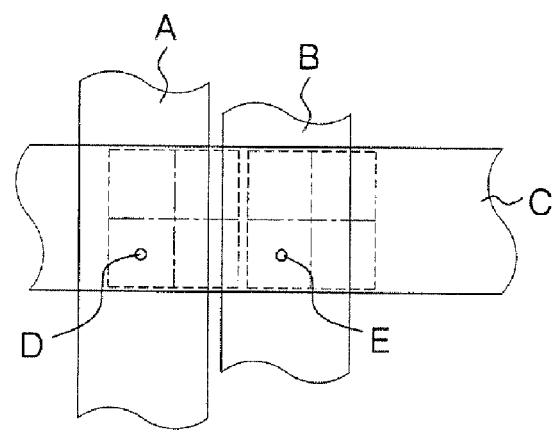

FIG. 7 illustrates the layout of a storage device assembly according to an exemplary embodiment of the present invention, FIG. 8A is an enlarged view of a portion of a storage medium according to an exemplary embodiment of the present invention, FIG. 8B is an enlarged view of a portion of a probe array according to an exemplary embodiment of the present invention, and FIGS. 9A through 9D are plan views illustrating a method of reading/writing data from/to a storage device according to an exemplary embodiment of the present invention. In FIGS. 8A and 8B, and 9A through 9D, reference character "C" refers to a portion of a data storage element, "DS" refers to data storage regions defined on a surface of the data storage element, "A" refers to a first metal interconnection, "B" refers to a second metal interconnection, and "D" and "E" refer to probes. The data storage regions "DS" are regions corresponding to probes of a probe array. The surface of each of the data storage regions "DS" is divided into four quadrants p1, p2, p3, and p4, each of which has a central portion that is defined as a binary digit portion.

Referring to FIGS. 7, 8A and 8B, and 9A through 9D, a probe array 300 is disposed opposite to a storage medium 302. Specifically, the probe substrate 306 of the probe array 300 is aligned with the storage substrate 308 of the storage medium 302 such that probes 310 disposed under the probe substrate 306 are aligned with data storage elements formed on the storage substrate 308, thus forming a storage device. Since components of the probe array and storage medium are explained above, a detailed description thereof will be omitted here.

A control unit 304 may operate the probe substrate 306 of the probe array 302 or the storage substrate 308 of the storage medium 302. The control unit 304 may include digitalized information on the positions of binary digit portions disposed in the data storage regions "DS." The control unit 304 including the digitalized position information may transfer the probe substrate 306 or the storage substrate 308 such that a probe corresponding to one data storage region "DS" is positioned on one of the four quadrants p1, p2, p3, and p4, i.e., the binary digit portions. As shown in FIGS. 9A through 9D, the control unit 304 may transfer the probe substrate 306 or the storage substrate 308 such that a selected probe 310 is positioned on a selected quadrant from the four quadrants p1, p2, p3, and p4. A distance by which the probe substrate or the storage substrate is transferred may be 50 nm or less.

The control unit 304 may transmit electrical signals to the metal interconnections or the lower electrodes. Thus, after a probe is positioned on a selected binary digit portion from the four binary digit portions, the control unit 304 may apply a voltage to the probe positioned on the selected binary digit portion so that data may be read from or written in the selected binary digit portion.

The movement of a probe to the selected quadrants from the four quadrants p1, p2, p3, and p4 may be implemented by the control unit 304. The control unit may include a digitalized position information of the four quadrants p1, p2, p3, and p4. For example, the digitalized position information of the four quadrants p1, p2, p3, and p4 may be (0,0), (0,1), (1,0), and (1,1). Accordingly, since the control unit 304 may move the probe to a desired binary digit portion disposed in the data storage region "DS," the storage device may randomly access data.

In some embodiments, a probe may move only within the data storage region "DS." Since a probe may move in bit units, the probe may only have to move a very short distance to reach the selected binary digit region of the data storage region "DS." The distance between the probes may be smaller than the resolution limit in a lithography process. Accordingly, since a probe may only need to move a short distance, the durability of the storage device may be increased. As a result, even though some embodiments of storage devices according to the present invention may not use a cantilever for moving the probe along a z-axis, the storage device may be as durable as a conventional storage device. Consequently, data may be read from or written to the storage device at higher speed and may be randomly accessed.

Since probes of some embodiments of the present invention may be arranged at very high densities, a storage device utilizing the probes may not require a control unit for operation. Instead, a novel storage device in which the probes are fixed onto the data storage region "DS" may be provided according to the present invention. Although such a novel storage device may stores data at lower density than when a control unit is adopted, the fabrication cost may be greatly reduced.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

The invention claimed is:

1. A method of fabricating a probe array, comprising:
   forming a mold insulating layer on a sacrificial substrate;
   first patterning the mold insulating layer, thereby forming first holes exposing the sacrificial substrate;
   forming a first conductive layer on the sacrificial substrate having the first holes;
   first planarizing the first conductive layer, thereby forming first probes arranged two-dimensionally in row and column directions on a sacrificial substrate;
   second patterning the mold insulating layer, thereby forming second holes exposing the sacrificial substrate;
   forming a second conductive layer on the sacrificial substrate having the second holes;
   second planarizing the second conductive layer, thereby forming second probes between the first probes arranged in the row direction;
   forming a probe substrate above the first and the second probes; and
   removing the sacrificial substrate.

2. The method of claim 1, further comprising, after forming the first holes, forming first hole spacers to cover sidewalls of the first holes.

3. The method of claim 1, further comprising, after forming the second holes, forming second hole spacers to cover sidewalls of the second holes.

4. The method of claim 1, wherein the mold insulating layer comprises a lower mold insulating layer, a planarization stop layer, and an upper mold insulating layer that are sequentially stacked, the upper mold insulating layer being removed during the planarization of the second conductive layer.

5. The method of claim 1, wherein a top surface of each of the first and second probes has an area equal to or greater than a bottom surface thereof.

6. The method of claim 1, further comprising, before forming the probe substrate:
   forming first metal interconnections to cover the first probes arranged in the column direction; and
   forming second metal interconnections between the first metal interconnections to cover the second probes.

7. The method of claim 6, wherein forming the first metal interconnections comprises:
   forming an intermetal dielectric layer on the sacrificial substrate having the first and second probes;
   patterning the intermetal dielectric layer, thereby forming first grooves exposing the first probes arranged in the column direction;
   forming first groove spacers to cover sidewalls of the first grooves;
   forming a first metal layer on the sacrificial substrate having the first groove spacers; and
   planarizing the first metal layer.

8. The method of claim 7, wherein forming the second metal interconnections comprises:
   patterning the intermetal dielectric layer, thereby forming second grooves exposing the second probes between the first metal interconnections;
   forming second groove spacers to cover sidewalls of the second grooves;
   forming a second metal layer on the sacrificial substrate having the second groove spacers; and
   planarizing the second metal layer.

9. The method of claim 1, further comprising, before forming the probe substrate:
   forming third probes between the first probes arranged in the column direction; and
   forming fourth probes between the second probes arranged in the column direction.

10. The method of claim 9, further comprising, after forming the fourth probes:
    forming first metal interconnections to cover the first and third probes arranged in the column direction; and
    forming second metal interconnections between the first metal interconnections to cover the second and fourth probes.

11. A method of fabricating a probe array, comprising:
    forming a first mold insulating layer on a sacrificial substrate;
    forming first probes penetrating the first mold insulating layer;
    forming first metal interconnections to cover the first probes arranged in a column direction;
    forming a second mold insulating layer on the sacrificial substrate having the first metal interconnections;
    forming second probes between the first probes arranged in a row direction, wherein the respective second probes are formed through the second mold insulating layer and the first mold insulating layer; and
    forming second metal interconnections to cover the second probes arranged in the column direction, wherein the second metal interconnections are formed on a level different from the first metal interconnections and are spaced apart from the first metal interconnections.

12. The method of claim 11, wherein forming the first probes comprises:
    patterning the first mold insulating layer, thereby forming first holes exposing the sacrificial substrate;
    forming first hole spacers to cover sidewalls of the first holes;
    forming a first conductive layer on the first mold insulating layer to fill the first holes; and
    planarizing the first conductive layer.

13. The method of claim 11, wherein forming the second probes comprises:
    patterning the second mold insulating layer and the first mold insulating layer, thereby forming second holes exposing the sacrificial substrate;
    forming second hole spacers to cover sidewalls of the second holes;
    forming a second conductive layer on the sacrificial substrate having the second holes; and
    planarizing the second conductive layer.

14. A probe array comprising:
    first probes arranged two-dimensionally in row and column directions;
    second probes disposed between the first probes arranged in the row direction;
    a probe substrate disposed on the first and second probes;
    first metal interconnections disposed between the probe substrate and the first probes arranged in the column direction;
    second metal interconnections disposed between the probe substrate and the second probes arranged in the column direction; and
    insulating spacers disposed between the first metal interconnections and the second metal interconnections.

15. A probe array comprising:
    first probes arranged two-dimensionally in row and column directions;
    second probes disposed between the first probes arranged in the row direction, wherein each of the first probes has a first height, and each of the second probes has a second height greater than the first height;

a probe substrate disposed on the first and second probes;

first metal interconnections disposed between the probe substrate and the first probes arranged in the column direction; and second metal interconnections disposed between the probe substrate and the second probes arranged in the column direction, wherein the second metal interconnections are disposed on a level different from the first metal interconnections and are spaced apart from the first metal interconnections.

16. The probe array of claim 14, further comprising:

third probes disposed between the first probes arranged in the column direction; and fourth probes disposed between the second probes arranged in the column direction.

* * * * *

UNITED STATES PATENT AND TRADEMARK OFFICE
CERTIFICATE OF CORRECTION

PATENT NO.        : 7,583,095 B2
APPLICATION NO.   : 11/464571
DATED             : September 1, 2009
INVENTOR(S)       : Dong-Chul Yoo et al.

Page 1 of 1

It is certified that error appears in the above-identified patent and that said Letters Patent is hereby corrected as shown below:

Column 2, after line 31, before line 32, insert the paragraph -- Some inventive principles of this patent disclosure relate to a probe array including first probes arranged two-dimensionally in row and column directions, second probes disposed between the first probes arranged in the row direction, a distance between the first and second probes being smaller than the resolution limit in a lithography process, a probe substrate disposed on the first and second probes. --;

Column 2, lines 38-43, delete the duplicate paragraph beginning with "Some inventive principles ..." and ending with "... the storage substrate";

Column 4, line 19, the word "Dmn" should read -- Dnm --;

Column 4, line 56, the word "elm" should read -- e1m --;

Column 5, line 10, the word "dmn" should read -- dnm --.

Signed and Sealed this

Eighth Day of December, 2009

David J. Kappos
*Director of the United States Patent and Trademark Office*